United States Patent
Nagorny

(10) Patent No.: US 12,068,134 B2
(45) Date of Patent: Aug. 20, 2024

(54) DIGITAL CONTROL OF PLASMA PROCESSING

(71) Applicant: Applied Materials, Inc., Santa Clara, CA (US)

(72) Inventor: Vladimir Nagorny, Tracy, CA (US)

(73) Assignee: Applied Materials, Inc., Santa Clara, CA (US)

(*) Notice: Subject to any disclaimer, the term of this patent is extended or adjusted under 35 U.S.C. 154(b) by 398 days.

(21) Appl. No.: 17/163,023

(22) Filed: Jan. 29, 2021

(65) Prior Publication Data

US 2022/0246403 A1    Aug. 4, 2022

(51) Int. Cl.
*H01J 37/32* (2006.01)

(52) U.S. Cl.
CPC .. *H01J 37/32449* (2013.01); *H01J 37/32743* (2013.01); *H01J 37/32935* (2013.01); *H01J 37/32366* (2013.01); *H01J 37/32623* (2013.01)

(58) Field of Classification Search
CPC ........... H01J 37/32082; H01J 37/32091; H01J 37/321; H01J 37/32357; H01J 37/32366; H01J 37/3244; H01J 37/32449; H01J 37/32532; H01J 37/32623; H01J 37/32743; H01J 37/32917; H01J 37/32926; H01J 37/32935; H01L 21/67253; H01L 21/67276; C23C 16/0227; C23C 16/0245; C23C 16/45561; C23C 16/45563; C23C 16/45565; C23C 16/45587; C23C 16/45589; C23C 16/45591; C23C 16/505; C23C 16/509; C23C 16/52

See application file for complete search history.

(56) References Cited

U.S. PATENT DOCUMENTS 5,834,905 A    11/1998  Godyak et al.
6,426,126 B1   7/2002   Conover et al.
(Continued)

FOREIGN PATENT DOCUMENTS

JP    2015527701 A    9/2015
KR    20200086808 A   7/2020
WO    2013184835 A1   12/2013

OTHER PUBLICATIONS

Godyak, V et al. "Distributed Ferromagnetic Inductively Coupled Plasma as an Alternative Plasma Processing Tool", Japanese Journal of Applied Physics, published Oct. 24, 2006, vol. 45, No. 10B, pp. 8035-8041.

(Continued)

*Primary Examiner* — Benjamin Kendall
*Assistant Examiner* — Joshua Reyes
(74) *Attorney, Agent, or Firm* — Lowenstein Sandler LLP

(57) ABSTRACT

A system including a control plate disposed within a processing chamber. The control plate includes a set of plasma elements designed to independently expose a substrate disposed within the processing chamber to plasma related fluxes. The control plate is designed to independently activate the set of plasma elements. When activated the associated plasma elements expose the substrate to the plasma related fluxes and when not activated the associated plasma elements prevent exposure of the substrate to the plasma related fluxes. The control plate is designed to perform individual time-dependent activation of the set of plasma elements to selectively expose the substrate to the plasma related fluxes.

20 Claims, 20 Drawing Sheets

(56) References Cited

U.S. PATENT DOCUMENTS

| | | |
|---|---|---|
| 6,486,431 B1 | 11/2002 | Smith et al. |
| 6,707,051 B2 | 3/2004 | Shun'ko |
| 7,110,486 B2 | 9/2006 | Adachi et al. |
| 7,363,876 B2 | 4/2008 | Lai et al. |
| 8,444,870 B2 | 5/2013 | Godyak |
| 9,960,073 B2* | 5/2018 | Huh .................. H01J 37/32752 |
| 10,083,817 B1 | 9/2018 | Godyak |
| 2002/0007793 A1* | 1/2002 | Sakai ................ H01J 37/32009 |
| | | 118/723 E |
| 2003/0015965 A1 | 1/2003 | Godyak |
| 2003/0075273 A1* | 4/2003 | Kilpela ................. C23C 16/507 |
| | | 156/345.33 |
| 2006/0102286 A1 | 5/2006 | Kim |
| 2008/0241387 A1* | 10/2008 | Keto ................. C23C 16/45536 |
| | | 118/728 |
| 2008/0308409 A1* | 12/2008 | Brcka ...................... H05H 1/46 |
| | | 422/186.29 |
| 2015/0137677 A1 | 5/2015 | Sohn |
| 2016/0047039 A1* | 2/2016 | Hirose ............. C23C 16/45527 |
| | | 118/715 |
| 2016/0053376 A1* | 2/2016 | Nam ................... C23C 16/5096 |
| | | 118/723 R |
| 2016/0064184 A1 | 3/2016 | Brown et al. |
| 2016/0156066 A1 | 6/2016 | Gleason et al. |
| 2016/0160351 A1* | 6/2016 | Seo ................... C23C 16/45565 |
| | | 118/723 R |
| 2017/0186589 A1 | 6/2017 | Sato et al. |
| 2017/0303383 A1 | 10/2017 | Kirkpatrick et al. |
| 2017/0372870 A1 | 12/2017 | Godyak et al. |
| 2018/0057937 A1* | 3/2018 | Lee ................... H01J 37/32449 |
| 2019/0122860 A1* | 4/2019 | Lee ...................... H01L 21/6831 |
| 2019/0122866 A1* | 4/2019 | Nam .................. H01L 21/3065 |
| 2019/0122867 A1* | 4/2019 | Nam ................. H01J 37/32899 |
| 2020/0227240 A1* | 7/2020 | Na .................... H01J 37/32137 |
| 2022/0193642 A1 | 6/2022 | Habib et al. |

OTHER PUBLICATIONS

Godyak, V. "Ferromagnetic enhanced inductive plasma sources"; Journal of Physics D., published Jun. 25, 2013, 24 pages, vol. 46; IOP Publishing.

Internerational Search Report and Written Opinion for International application No. PCT/US2022/013408, mailed May 9, 2022, 9 pages.

International Search Report and Written Opinion for International Application No. PCT/US2022/012577, mailed May 9, 2022, 9 Pages.

* cited by examiner

DIGITAL CONTROL OF PLASMA PROCESSING

The present application is related to U.S. patent application Ser. No. 17/736,920 filed May 4, 2022, entitled "Addressable Plasma Delivery Methods And Devices", which is a continuation of U.S. patent application Ser. No. 17/163,066, filed Jan. 29, 2021, entitled "Image-Based Digital Control Of Plasma Processing".

TECHNICAL FIELD

Some embodiments of the disclosure relate, in general, to digital control of plasma processing. Embodiments additionally relate to systems, device, and methods for plasma delivery and/or plasma processing.

BACKGROUND

Plasma processing is widely used in the semiconductor industry. Plasma can modify a chemistry of a processing gas (e.g., generating ions, radicals, etc.), creating new species, without limitations related to the process temperature, generating a flux of ions to the wafer with energies from a small fraction of an electronvolt (eV) to thousands of eVs. There are many kinds of plasma sources (e.g., capacitively coupled plasma (CCP), inductively coupled plasma (ICP), microwave generated plasma, electron cyclotron resonance (ECR), and the like) that cover a wide operational process range from a few mTorr to a few Torr.

A common plasma process specification today is a high uniformity of the process result (e.g., a uniformity across a wafer up to the very edge of the wafer). This standard is often very difficult to achieve, because it involves many factors, many of which interfere with others. Plasma uniformity, chamber design, wafer temperature distribution, design of the bias electrode, etc. are only part of those factors. To satisfy these criteria, one designs both RF antennas and processing chambers to achieve the highest level of process uniformity. This often leads to large dimensions of a chamber and power generators (e.g., antennas, coils, electrodes, etc.), large overall plasma volume, and other expensive measures, like complex temperature control, coil splitting magnetic field screens, etc. While basic process uniformity within a few percent can be fixed by a general tool design, even these measures are often inadequate, when uniformity criteria become stricter. A chamber then has to be equipped with elements that can allow individual tuning of the chamber for specific processes. In addition, large plasma volume by itself may be a problem for processes that require quick change of chemistry.

One can observe a parallel between plasma processing and TV. Originally TV was based on Cathode Ray Tube (CRT) technology, where an electron beam scans horizontally and vertically inside a vacuum tube exciting phosphor dots on the front panel of the tube, making about 25 frames per second. Each phosphor dot flashes light for a short (fixed) time and the brightness of this flash is controlled by the electron beam current. Then a receptor (e.g., an eye) integrates for a brief time duration and averages the brightness of light coming from every phosphor dot. The color of the dot is determined by the ratio of average brightness of neighboring color dots and the brightness is by an overall intensity of the light from these dots. The analog nature of CRT image control is in the control of intensity of the electron beam, or in the peak brightness of every light flash. CRT and other analog systems reveal challenges of maintaining specific process specification (e.g., power requirements, chamber size, element specification limitation, etc.) due to the strict specification requirements to perform the process. Like CRT, analog systems generally often lack the flexibility demanded by modern innovation in various fields of process control. For this reason analog system are often manufactured with a specialized specification to perform a specific narrow range of processes.

Growing problems with CRT technology were resolved by switching to a digital technology, which of course required changing both the hardware, the signal and the signal control. Apparently, to switch analog technology to a digital one in plasma processing, one will have to change both—hardware and control.

SUMMARY

In an example embodiment, a method includes receiving, by a processing device, data including a first set of plasma exposure values each associated with a respective plasma element of a plurality of plasma elements designed to generate plasma related fluxes. The processing device causes a plasma controller to activate the set of plasma elements based on the data to expose a substrate to the plasma related fluxes generated by the set of plasma elements during a plasma process. Each respective plasma element of the set of plasma elements is activated for a duration based on a respective plasma exposure value from the first plurality of plasma exposure values that is associated with the respective plasma element.

In an example embodiment, a method includes receiving, by a processing device, first data including a first set of plasma exposure durations each associated with a respective plasma element of a set of plasma elements designed to generate plasma related fluxes. The processing device receives a first thickness profile of a substrate. The first thickness profile includes a first set of thickness values of the first substrate measured after exposing the first substrate to the plasma related fluxes for the respective plasma exposure durations defined in the first data. The processing device determines that the first thickness value includes a first thickness value for a first location on the first substrate associated with a first plasma element of the plurality of plasma elements that deviates from a reference thickness value. The processing device, responsive to determining that the first thickness profile includes the first thickness value that deviates from the reference thickness value, modifies the first data by changing a first plasma exposure duration of the plurality of plasma exposure durations that is associated with the first plasma element.

In an example embodiment, a plasma processing system includes a processing chamber and an actuator plate disposed within the processing chamber. The actuator plate includes a set of plasma cells. The plasma processing system further includes a control unit coupled to the actuator plate, the control unit is to control the actuator plate by independent activation or deactivation of the plurality of plasma cells. Responsive to being activated the plasma cells are to independently expose a local area of a substrate disposed within the process chamber to plasma related fluxes.

In an example embodiment, a system includes a processing chamber and an actuator plate disposed within the processing chamber. The actuator plate includes a set of plasma elements to independently expose a substrate disposed within the processing chamber to plasma related fluxes. The actuator plate is to independently activate the plurality of plasma elements. Responsive to being activated, a plasma element is to independently expose a local area of the substrate to the plasma related fluxes. The actuator plate is to perform individual time-dependent activation of the plurality of plasma element to selectively expose the substrate to the plasma related fluxes. In an example embodiment, a plasma processing device includes a plasma source to generate a plasma. The plasma processing device further includes an actuator plate disposed in a path of the plasma. The actuator plate includes a plurality of plasma elements to independently be activated and deactivated. Responsive to being activated the plasma elements expose a substrate to the plasma related fluxes. The plasma processing device further includes a control unit. The control unit controls the actuator plate. The control unit perform individual time-dependent activation of the plurality of plasma element to selectively expose the substrate to the plasma related fluxes.

BRIEF DESCRIPTION OF THE DRAWINGS

The disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION

Figure 1A:
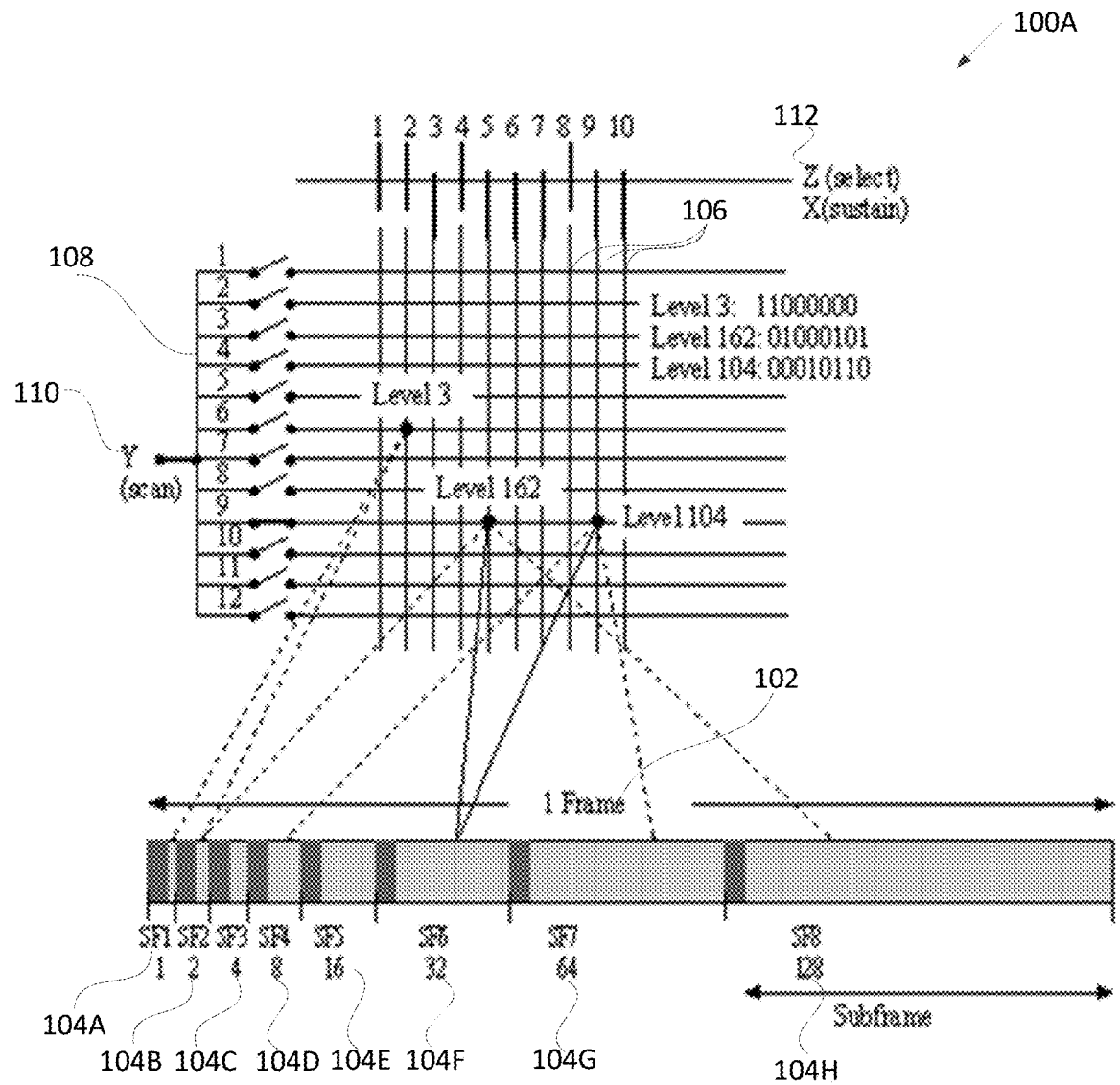
FIGS. 1A-C illustrate digital imaging used in a digital process control system, according to aspects of the disclosure.

A common plasma process parameter today is a high uniformity of a process result (e.g., a uniformity across a wafer up to the very edge of the wafer). This parameter is often very difficult to achieve, because it involves many factors, many of which interfere with others. Plasma uniformity, chamber design, wafer temperature distribution, design of the bias electrode, etc. are only part of those factors. Radio frequency (RF) antennas and processing chambers are manufactured and assembled to achieve the highest level of process uniformity. This often leads to large dimensions of a chamber and power generators (e.g., antennas, coils, electrodes, etc.), large overall plasma volume, and other expensive measures, like complex temperature control, coil splitting, magnetic field screens, etc. While basic process uniformity within a few percent can be fixed by a general tool design, even these measures are inadequate for stricter uniformity criteria. A chamber then has to be equipped with elements that can allow individual tuning of the chamber for specific processes. In addition, large plasma volume, by itself, may be a problem for processes that require quick change of chemistry.

In addition, difficulties exist within process development to satisfy both local process results (e.g., film properties, etc.) and uniformity criteria. When a process tool is manufactured, conventionally it is tested and optimized for just a few processes. As more processes are developed, the conventional tool has limited means to control process results, such as by controlling power in antennas, gas pressure, gas flow, gas flow distribution, temperature of a wafer, chamber walls, and the like. Many of these control knobs affect multiple plasma parameters which is often difficult to predict, because they have global influence. For example, changing power in one coil may affect the plasma density everywhere, may affect the ion energy, etc. These difficulties and the absence of a clear (not ambiguous) way for using these knobs result in a very high cost of process development, which sometimes may call for hardware modification and re-qualification of the tool.

These problems can be mitigated, and in some cases eliminated if an analog process control is replaced with a digital process control. As we mentioned above, replacing an analog process control with a digital process control would likely require different hardware. The main difference between hardware for analog and digital systems is that analog systems often have very few elements (1-2 coils; 1-2 zone ESC, . . . ) and, respectively, very few controlling elements to control parameters globally, while digital systems are often configured for local control of small areas of the wafer and thus normally should have a lot of identical controlled elements/cells (e.g. 200-1000 zones ESC, etc.) and appropriately a large number of controlling elements. Contrary to analog systems, where those few elements operate for the same time, but energized to carefully adjusted/controlled levels, in a digitally controlled system one energize/activate every cell (e.g., pixel) to the same level (e.g. powered), however, the exposure time of each cell may be controlled. The dependency between process parameters (e.g., thickness) and input parameters (e.g. cell exposure duration) is streamlined allowing a user or process recipes to alter or change parameters without performing an equipment overhaul or mass restructuring. Digital control also allows for a consistent power input across exposure sources often resulting in simpler electronic configurations and equipment setups capable of performing multiple processes.

To better understand how the digital process control can be realized, we draw a comparison between analog system and digital system. Indeed, in plasma processing the process result on the film (removal, or deposition, or treatment) grows with time and flux of the plasma species to the substrate. So if one needs to increase process result globally or locally, one needs to increase flux or time. In the end, it is the fluence (integral of the flux density over time) that affects the resulting process image. For example, in TV imaging—the brightness or color of each pixel that the eye sees depends on the average brightness of this pixel over about 0.1 s, or the fluence of photons in that time. In CRT, every pixel emitted light for the same time, so one varied brightness over the screen by changing the flux density (electron beam current illuminating the pixel). In digital processing (independent of technology) each pixel emits light with fixed intensity, and the average brightness of every individual pixel during one frame (fluence over the frame) can be controlled by the fraction of a timeframe that that pixel is lit. Typical grey scale of any color pixel in digital TV can be 256 or 512 grey levels, which allows for millions of colors. This grey scale and its consistency can be achieved by splitting every frame (image) into a set of subframes, each subframe shows a different image for a time (sustain period) assigned for this subframe, and during all subframes illuminated pixels can emit light of the same fixed intensity. However, some pixels are lit during one subframe and others are lit during other subframes. Different combination of pixels may be lit for any number of subframes. The human eye is not fast enough to recognize each subframe. The human eye sees the integral image of a several frames, or the image of a fluence of light from every pixel. For example, for 8 subframes, realizing 256 levels of intensity, the time for each subframe can depend on the subframe number m as $2^{m-1}$, so the contribution of each subframe to overall fluence of the frame increases with the subframe number, so the average brightness (fluence) of every pixel may have 256 variation from 0 to 255.

The example below shows an example of the splitting one 3×3 image (where the numbers are indicative of a brightness level) into a number of subframe images, assuming that each subframe is twice as long as the previous, so its contribution to the brightness grows as $2^{m-1}$:

$$\begin{array}{c} \phantom{Y_1}\begin{array}{ccc} Z_1 & Z_2 & Z_3 \end{array} \\ \begin{array}{c} Y_1 \\ Y_2 \\ Y_3 \end{array}\underbrace{\begin{pmatrix} 1 & 2 & 3 \\ 0 & 2 & 1 \\ 2 & 0 & 4 \end{pmatrix}}_{\text{Image}} = \end{array}$$

$$\underbrace{\begin{pmatrix} 1 & 0 & 1 \\ 0 & 0 & 1 \\ 0 & 0 & 0 \end{pmatrix}}_{SF1} + \underbrace{\begin{pmatrix} 0 & 1 & 1 \\ 0 & 1 & 0 \\ 1 & 0 & 0 \end{pmatrix}}_{SF2} + \underbrace{\begin{pmatrix} 0 & 0 & 0 \\ 0 & 0 & 0 \\ 0 & 0 & 1 \end{pmatrix}}_{SF3} + \underbrace{\begin{pmatrix} 0 & 0 & 0 \\ 0 & 0 & 0 \\ 0 & 0 & 0 \end{pmatrix}}_{SF4} + \ldots + \underbrace{\begin{pmatrix} 0 & 0 & 0 \\ 0 & 0 & 0 \\ 0 & 0 & 0 \end{pmatrix}}_{SFlast}$$

In order to have different images for every subframe, each subframe can include an address period preceding a sustain period. The address period may include erasing the previous image and placing a new image on the screen. This updating of the address may include an addressable memory element assigned to each pixel, which can be addressed to ON or OFF state. The ON or OFF state may affect pixel operation (e.g. to emit light or not) during the sustain period. Addressing may include circuitry for selecting pixels and supply them with address signal to carry out the addressing process.

In some embodiments, methodology include splitting the process time into a number of subfields and controlling fluence of plasma fluxes to elements of the substrate with time, rather than with flux density, as conventionally used for plasma processing. In some embodiments, methodology is used for selecting and quick addressing of thousands of plasma cells, which drastically reduces the number of controlling elements compared to a number of controlled elements.

Embodiments of the disclosure provide for plasma processing devices, methods, and systems using digital process control. Specifically, embodiments disclosed herein are directed to devices, systems, and processes for controlling a plasma process through individual time dependent exposure of plasma related fluxes by plasma elements. Embodiments are directed to performing plasma processes (e.g., semiconductor processing) by digitally controlling a local exposure of the elements of the substrate to plasma related fluxes. Embodiments are directed to generating and processing exposure data (e.g., exposure maps or exposure recipes) across a set of plasma elements to individually control exposure durations corresponding to individual plasma elements. Various embodiments may include or employ methods for tuning and/or refining exposure data (e.g., exposure maps or recipes). Some embodiments incorporate the use of machine learning models and algorithms to generate, modify, and/or process exposure maps and/or recipes and plasma process modifications to achieve target process outputs (e.g., meet target specifications such as thickness and/or process uniformity).

In an example embodiment, a method includes receiving, by a processing device, data including a first set of plasma exposure values each associated with a respective plasma element of a plurality of plasma elements designed to generate plasma related fluxes. The processing device causes a plasma controller to activate the set of plasma elements based on the data to expose a substrate to the plasma related fluxes generated by the set of plasma elements during a plasma process. Each respective plasma element of the set of plasma elements is activated for a duration based on a respective plasma exposure value from the first plurality of plasma exposure values that is associated with the respective plasma element.

In an example embodiment, a method includes receiving, by a processing device, first data including a first set of plasma exposure durations each associated with a respective plasma element of a set of plasma element designed to generate plasma related fluxes. The processing device receives a first film thickness (process result) profile of a substrate. The first thickness profile includes a first set of thickness values of the first substrate measured after exposing the first substrate to the plasma related fluxes for the respective plasma exposure durations defined in the first data. The processing device determines that the first thickness value includes a first thickness value for a first location on the first substrate associated with a first plasma element of the plurality of plasma elements that deviates from a reference thickness value. The processing device, responsive to determining that the first thickness profile includes the first thickness value that deviates from the reference thickness value, modifies the first data by changing a first plasma exposure duration of the plurality of plasma exposure durations that is associated with the first plasma element.

In an example embodiment, a plasma processing system includes a processing chamber and an actuator plate disposed within the processing chamber. The actuator plate includes a set of plasma cells. The plasma processing system further includes a control unit coupled to the actuator plate, the control unit is to control the actuator plate by independent activation or deactivation of the plurality of plasma cells. Responsive to being activated the plasma cells are to independently expose a local area of a substrate disposed within the process chamber to plasma related fluxes.

In an example embodiment, a system includes a processing chamber and an actuator plate disposed within the processing chamber. The actuator plate includes a set of plasma elements to independently expose a substrate disposed within the processing chamber to plasma related fluxes. The actuator plate is to independently activate the plurality of plasma elements. Responsive to being activated, a plasma element is to independently expose a local area of the substrate to the plasma related fluxes. The actuator plate is to perform individual time-dependent activation of the plurality of plasma element to selectively expose the substrate to the plasma related fluxes. In an example embodiment, a plasma processing device includes a plasma source to generate a plasma. The plasma processing device further includes an actuator plate disposed in a path of the plasma. The actuator plate includes a plurality of plasma elements to independently be activated and deactivated. Responsive to being activated the plasma elements expose a substrate to the plasma related fluxes. The plasma processing device further includes a control unit. The control unit controls the actuator plate. The control unit performs individual time-dependent activation of the plurality of plasma element to selectively expose the substrate to the plasma related fluxes.

These and similar embodiments provide a number of advantages and improvements in the fields of plasma processing and semiconductor processing. These advantages include, for example, improved process precision, improved process resolution, increased flexibility of equipment specification and process use. As noted previously, conventional global process controls that use analog system present difficulties meeting uniformity requirements. By using a digital local process control system, or time dependent local exposure control, the control parameters are much easier to adjust for different processes or target outcomes. Additionally, the level of precision and resolution can be adjusted by adjusting exposure instructions for a digital process control system. For example, process distortions, process artifacts, limitations on size and shape of equipment are overcome when the process control is time dependent instead of power dependent, like most analog process control system. Resolution can be controlled by the number of process sources without major peripheral equipment changes or changes to relative process uniformity.

As mentioned previously, using a digital process control allows for more flexible system control. The dependency between process result parameters (e.g., film thickness change) and input parameters (e.g. cell exposure duration) is streamlined allowing an operator to adjust the process recipe (multiple exposure times) without requiring an equipment overhaul or restructuring. Digital control also allows for a consistent power input across exposure sources often resulting is simpler, cheaper, and broader use electronic configurations and equipment setups capable of performing multiple processes.

Figure 1B:
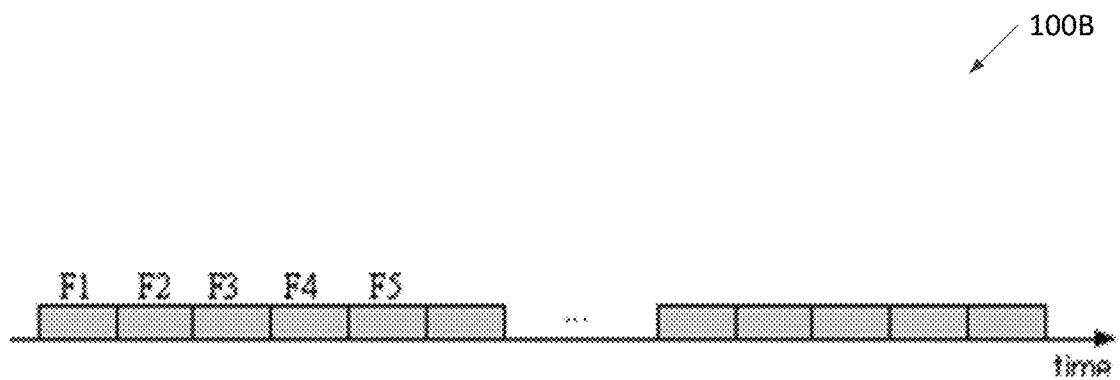
Figure 1C:
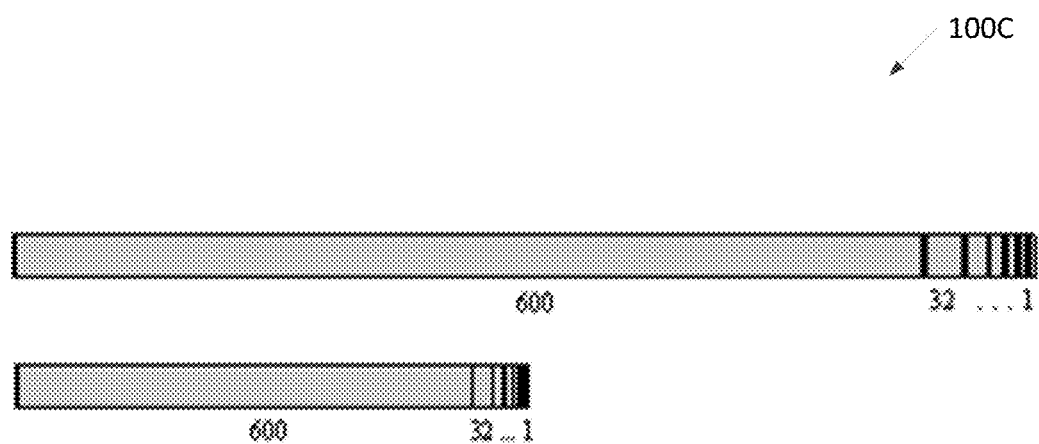

FIGS. 1A-1C illustrates digital imaging used in a digital process control system 100A, according to aspects of the disclosure. Particularly, FIG. 1A illustrates a principle of creating an image (e.g. a collection of image frames 102) using subframes 104A-H as well as scanning techniques for addressing controlled elements 106 of the digital process control system 100A. Plasma processing can operate with a large number of controlled elements 106 (e.g. pixels, cells, electrodes, etc.) that emit light or plasma, control plasma fluxes, etc. For example, plasma processing systems may operate with hundreds or thousands of plasma cells. In any case, a large number of controlled elements 106 can require a high degree of control to carry out the digital process to meet a desired output standard (e.g. process uniformity requirements). For example, as shown in FIG. 1A, every frame 102 (e.g. 16.7 msec for TV) can be divided into a series of subframes 104A-G (e.g. 8 subframes as seen in FIG. 1A). Each subframe can be representative of a duration of controlled element 106 activation (sustain) periods, growing with the subfield number m as $T_m = T_1 2^{m-1}$.

Each sustain period can be preceded by an address period. The address period includes erasing (e.g. OFF state) the previous state of all of the controlled elements 106 and addressing (e.g. ON state) a new selection of controlled elements 106. During the following sustain period, all elements that were selected ON are activated (e.g. emit light or plasma) of the fixed intensity. The emission duration by the pixels results in various levels of fluence. Different combinations of addressed controlled elements 106 of different subfields 104A-G of a frame 102 can be used to generate different exposure images. For example, controlled elements 106 having light emitting pixels can result in a fluence (e.g. brightness) with various level of grey (e.g. 256 levels of grey associated with the 8 subfields). This is due, in part, to the human eye integrating (i.e. summarizing) light from every pixel received during a selection of frames (e.g. integrating over the subfields). For example, if a pixel with coordinates (y, z) equal to (6, 2) emits a relative brightness of level 3, pixel (9, 5)—level 162, and pixel (9, 9)—level 104, then these pixels should be addressed ON for appropriate subframes that when summarized (e.g. integrated over the duration) result in the associated brightness levels (i.e. 3, 162, and 104), as shown in the FIG. 1A.

In some embodiments, improved addressing efficiency (e.g. shorter time to address the pixels) can be achieved through address scanning. Scanning is performed during an addressing period by disconnecting (e.g. connecting to ground) all lines along a first axis (e.g. horizontal lines 108) except one from a power supply (e.g. Y scan electrode 110). The first line is addressed, while the disconnected lines cannot be addressed (e.g. store or change charge) from an addressing signal. The addressing process carries on line by line where the line of controlled elements 106 (e.g. pixels or cells) connected to a power supply are being addressed. After a current line is addressed, the current line is disconnected from the power supply (e.g. Y scan electrode 110) and the next line is connected to it. After all lines are scanned, the address period ends and the sustain period begins. For example, FIG. 1A shows addressing of line 108 number 9 for the subframe SF6 104F. As shown in the FIG. 1A, the selected electrodes 3, 5, 6, 7, 9 and 10 are connected to address electrode Z 112. These selected electrodes on line 9 will be addressed and ultimately be lit during the processing of the SF6 subframe 104F.

Using a previous example (repeated below), an image can be represented by a 3×3 matrix, where each number is indicative of an emission duration of a controlled element. An exemplary splitting of 3×3 image into a number of subframe images can include the following:

$$\begin{matrix} & Z_1 & Z_2 & Z_3 \\ Y_1 \\ Y_2 \\ Y_3 \end{matrix} \begin{pmatrix} 1 & 2 & 3 \\ 0 & 2 & 1 \\ 2 & 0 & 4 \end{pmatrix}_{\text{Image}} =$$

$$\begin{pmatrix} 1 & 0 & 1 \\ 0 & 0 & 1 \\ 0 & 0 & 0 \end{pmatrix}_{SF1} + \begin{pmatrix} 0 & 1 & 1 \\ 0 & 1 & 0 \\ 1 & 0 & 0 \end{pmatrix}_{SF2} + \begin{pmatrix} 0 & 0 & 0 \\ 0 & 0 & 0 \\ 0 & 0 & 1 \end{pmatrix}_{SF3} + \begin{pmatrix} 0 & 0 & 0 \\ 0 & 0 & 0 \\ 0 & 0 & 0 \end{pmatrix}_{SF4} + \ldots + \begin{pmatrix} 0 & 0 & 0 \\ 0 & 0 & 0 \\ 0 & 0 & 0 \end{pmatrix}_{SFlast}$$

In this example, the scanning during SF1 can proceed in the following manner: 1) when Y1 is closed (e.g. connected to the power supply), the address signal (1, 0, 1) connects the first and third columns to the address driver; 2) when Y2 is closed, the address signal (0, 0, 1) connects the third column (e.g. Z3) to the address driver; and 3) when Y3 is closed, none of the Z electrodes is connected to Z driver. A similar process occurs for each addressing period for each subfield. In some embodiments, some subfield may not active (e.g. all elements in OFF state) any of the elements. Returning to the above example, starting from SF4, none of Z electrodes is connected to Z driver, thus no cell is addressed and no controlled elements are activated (e.g. no light or plasma is generated during these subfields).

During the sustain period all scan (line) electrodes (Y) can be connected together and to a power supply. Column electrodes (Z or X) are connected together and to a sustain driver of the power supply. In some embodiments, Z and X use the same electrodes in the cells, however, in other embodiments X is a separate electrode, common to every cell. While during the sustain period all cells are connected to the same sustain drivers, only cells selected ON during address period are activated (e.g. emit light or plasma).

A difference between digital TV and digital plasma processing is that digital TV can require a maximum frame duration limit to meet image quality standards. For example, TV frames are limited to being shorter than 0.1 s for viewing not to be disturbed by flickering, even of a static image, and about 6 times shorter (16.7 ms) to avoid moving picture artifacts. As a result, TV images are often shown through many 16.7 ms frames, as shown in FIG. 1B, for example. This requires a large number of addressing, which takes significant fraction of 16.7 ms frame, reducing light efficiency of the TV image.

In some embodiments, as shown in FIG. 1C, the whole process time or process step time may be performed as a single frame 100C (e.g. addressing a single frame). Using a single frame may be enabled as a result of not having a maximum frame duration limitation, as previously described in relation to a TV display. For example, the addressing time for each frame can be about a millisecond in duration and process time can be measured in many seconds or even minutes. The longer processing times can result in fewer addressing steps, which can improve the efficiency of the overall process.

In some embodiments, as shown in FIG. 1C, varying frame duration may be associated with image complexity. For example, a TV image can be relatively complex, so pixels may have the full range of brightness from 0 to 255. However, in plasma processing, the main image has a constant brightness (e.g. no contrast), and the resulting process result may satisfy a quality threshold that is not as precise as a TV image (e.g. 5% non-uniformity). As a result of this reduced image complexity requirement, one large subframe may be used for a bulk of the time (e.g. 90% of total process time) and a few smaller subfields (e.g. 6 subfields, as shown in FIG. 1C), may be used for the remaining process time (e.g. 10% of total process time).

In some embodiments, the subfields can be changed by a shared adjustment factor (e.g. all subfield are reduced by half). In some embodiments, using longer subfields can result in increased precision control by reducing the number of required subfields. For example, with 8 subfields, brightness can be controlled up to 0.4% (1/255) of the total brightness. However, using longer subfield brightness can be controlled up to 0.15% (1/663) of the total brightness with only 7 subfields.

In some embodiments, plasma cells used for plasma processing are able to control plasma fluxes in multiple conditions (e.g. different processing gases, different pressures, etc.) and control emitted energy (e.g. ion energy, bias voltage), which may require different driving voltages for different process steps. The uniformity control of every process can be performed using the digital control described herein.

In some embodiments, the number of subfields, the relative length of subfields, the number of frames processes, and/or process length can be adjusted to meet the requirement of a plasma process (e.g. a fabrication recipe). For example, the sustain and address voltage/signals can be modified and new gas mixtures can be introduced providing process recipe flexibility.

Figure 2A:
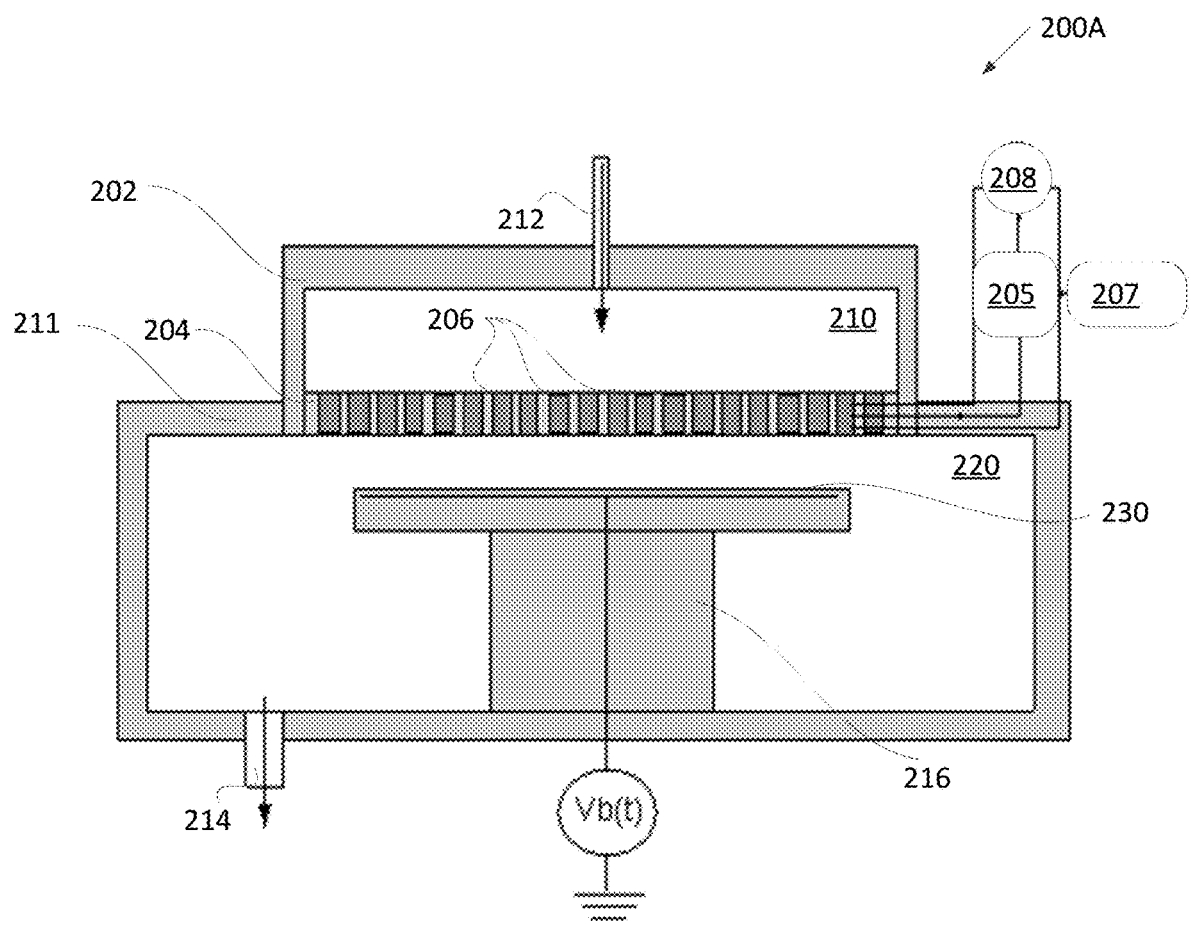
FIG. 2A-C illustrate embodiments of a plasma processing system, according to aspects of the disclosure.
Figure 2B:
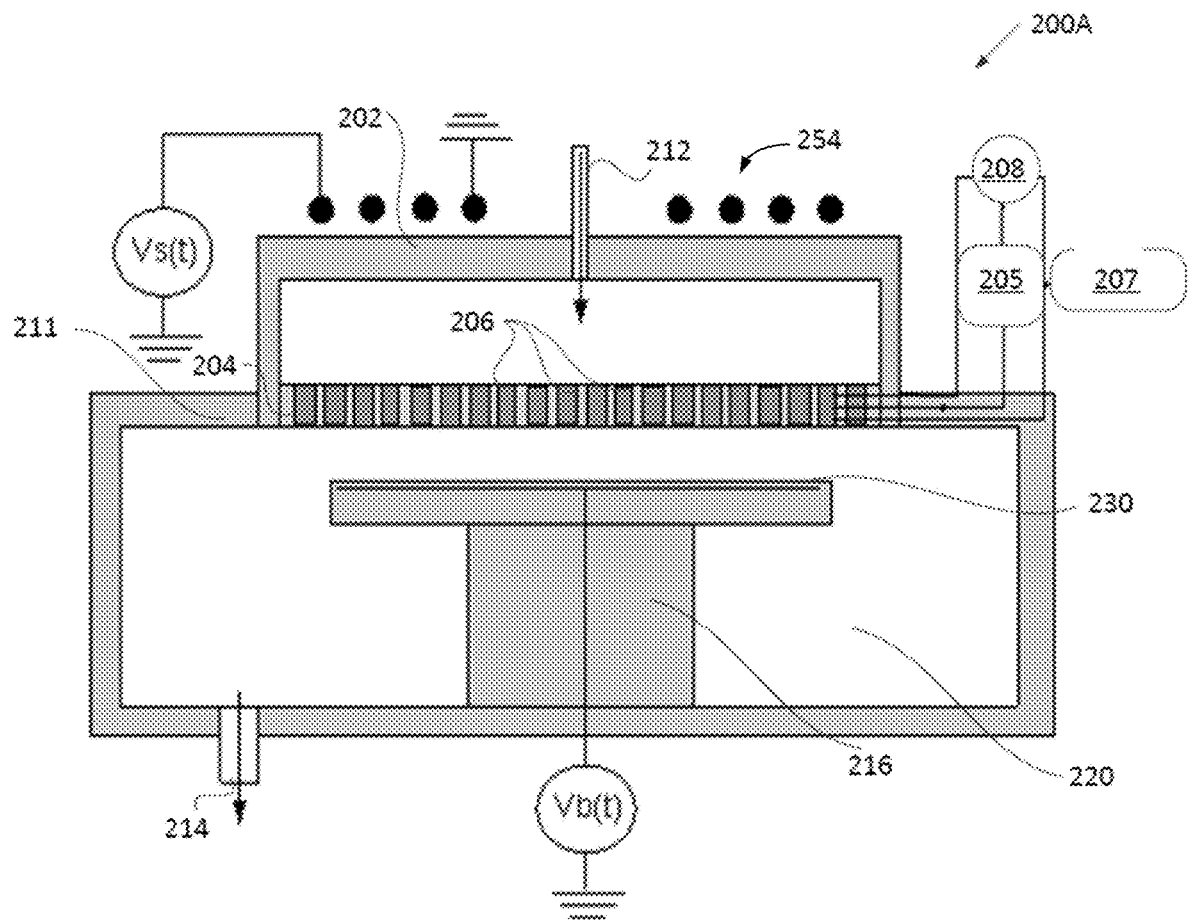
Figure 2C:
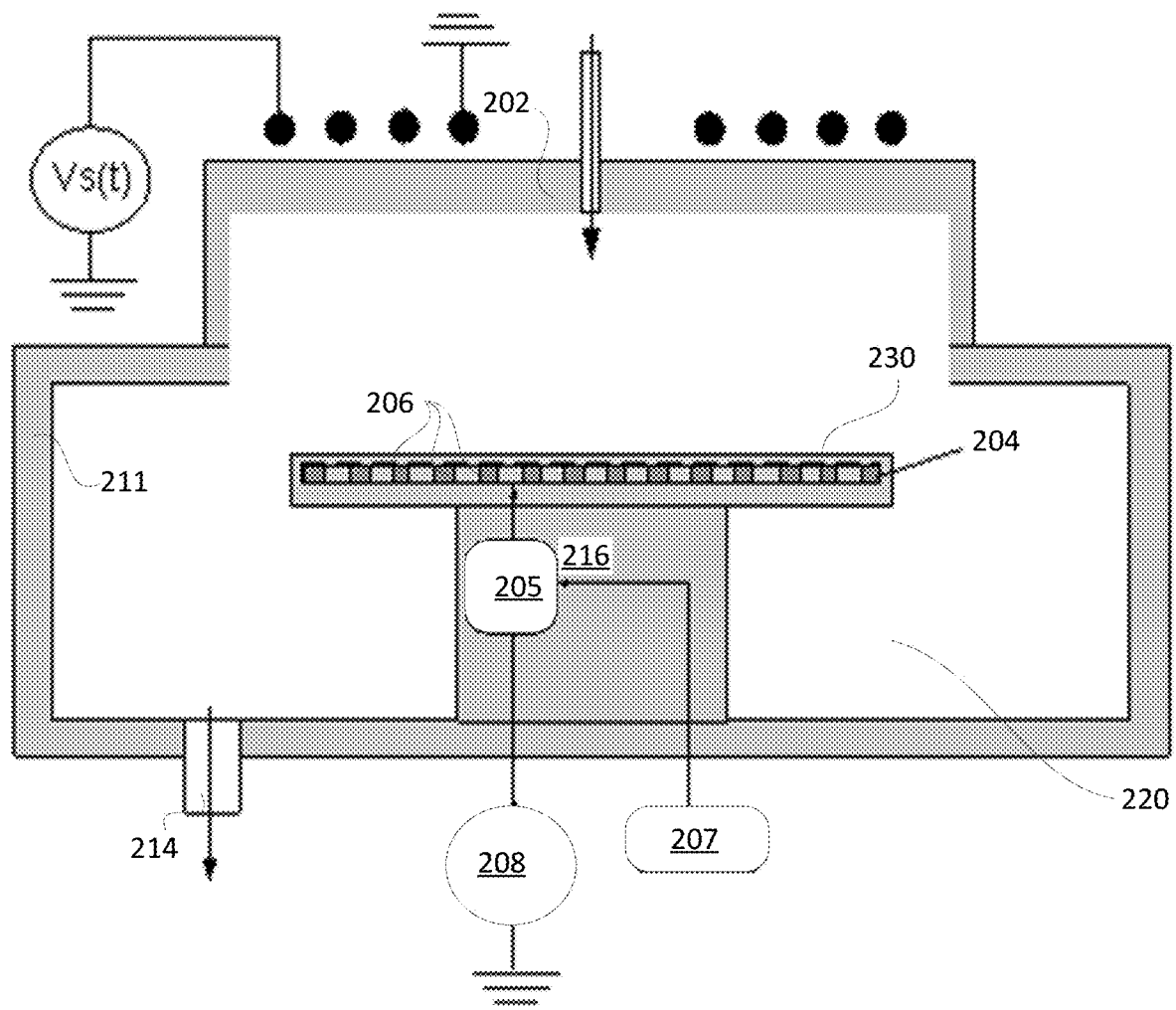

FIGS. 2A-C illustrate embodiments of a plasma processing system 200, according to aspects of the disclosure. The plasma processing system may include a processing chamber 220 and a plasma source 210. A plasma source comprises walls 202 (e.g. to hold the atmospheric pressure), a gas inlet 212, the gas distribution volume limited by the walls, the plasma generating plate 204, containing multiple controlled plasma elements 206, and the power supply 208 controlled by the control unit 205. In some embodiments, control unit 205 is also responsible for selection of plasma elements 206 which generate plasma when the same voltage V(t) is applied to all cells of the panel 204. The processing chamber 220 may be one or more of an etch chamber, a deposition chamber (including a chamber for atomic layer etch/deposition, chemical vapor deposition, physical vapor deposition, or plasma enhanced versions thereof), an anneal chamber, a photoresist strip chamber and/or the like. Processing chamber 220 includes walls 211 that holds inside vacuum and provides support to the plasma source 210, substrate support 216, and gas outlet 214 and may include features described in association with processing chambers in other embodiments. The gas inlet 212 and gas outlet 214 may provide a flow of feed gas through the processing system under the processing gas pressure. The feed gas may be comprise any of air, O2, N2, Ar, NH3, He and or other appropriate processing gases. Plasma source 210 may include a gas expansion volume of a gas injector (e.g. without plasma) which provides a uniform gas flow through plasma generating plate 204. The uniform gas flow across the surface of the control plate may result in a common gas composition flowing through each of the gas feed lines associated with the plasma elements 206.

In some embodiments, as shown in FIG. 2A, the plasma generating plate 204 may include a set of plasma elements with memory. The plasma elements 206 include individually addressable plasma sources or discharge cells capable of emitting plasma related fluxes. For example, the discharge cells may use a dielectric barrier discharge (DBD) technology for both generating discharge and providing memory function.

In some embodiments, the discharge cells may be disposed within the plasma generating plate 204. The discharge cells may be designed to individually switchable between an ON state and an OFF state. While in an ON state the discharge cells emit plasma related fluxes responsive to receiving a voltage (e.g. a sustain voltage).

In some embodiments, the plasma generating plate 204 is designed to coordinate individual time-dependent transitions between the on state and the off state for each discharge cell to selectively generate and emit plasma related fluxes across the plasma generating plate 204. For example, plasma related fluxes may be generated and emitted to contact a substrate 230 disposed within processing chamber 220.

In some embodiments, the plasma source 210 may include an RF (e.g., low frequencies less than 100 kHz) generator 208, or alternatively an alternating current (AC)

generator, that is designed to activate (e.g., deliver power) the plasma elements 206, and control unit that selects cells which are to receive the power from the generator. For example, discharge cells may include an addressable switch, which connects both cell electrodes to the RF bus electrodes only when closed, and disconnects the cell from the RF bus electrodes when the switch is open. Applying the RF voltage to an associated discharge cell results in the associated discharge cell being in the ON state and emitting plasma related fluxes. In a further example, the RF generator may be configured to apply an RF voltage to a first set of discharge cells for first time duration and apply the same RF voltage to a second set for a different time duration. In another embodiment, the RF generator may be designed to increase or reduce a power to maintain a predetermined voltage independent of the number of discharge cells being activated or in an ON state and/or the number of discharge cells not currently activated or in an OFF state.

In some embodiments, which exploit DBD technology, the plasma source may include a control unit that selects/addresses cells which receive a memory charge prior to plasma sustaining and an AC (1-200 kHz) power generator 208 with the fixed voltage amplitude designed to activate and sustain discharge in plasma elements (e.g. plasma cells) 206. Only selected plasma cells that have the memory charge will generate discharge, when the same sustaining waveform V(t) is applied to all cells. Activated cells can generate plasma and emit plasma related fluxes to a local area in the area of this cell.

In some embodiments, as shown in FIG. 2B, the plasma generating plate 204 is an actuator plate and is designed to perform individual time-dependent opening and closing of the plurality of plasma shutters to selectively expose regions of the substrate 230 to the ion and electron fluxes flowing through the individual elements 206 of the actuator plate. This embodiment, of course includes a plasma source (shown ICP source 254) generating plasma above the actuator plate.

In some embodiments, the plasma elements 206 include multiple electrode layers that perform the opening and closing that permits or blocks some of the plasma related fluxes from flowing through the actuator plate. The plasma elements 206 (e.g., plasma shutters) may include a first layer of electrodes (e.g. grid facing the plasma) disposed proximate and/or on a side of the plasma source 210. The first layer of the electrode may be maintained at a floating potential. The plasma elements 206 may include a second layer of electrodes that includes a first ring of electrodes that are maintained at a floating potential when an associated plasma shutter is open and are maintained at a negative potential (reflects electrons) when the associated one of the plurality of plasma shutters is closed. The plasma element 206 may include a third layer of electrodes that includes ring electrodes to be maintained at the floating potential when an associated plasma shutter is open and maintained at a positive potential (e.g. reflects ions) when the associated plasma shutter is closed.

In some embodiments, as shown in FIG. 2C, the plasma generating plate 204 is an actuator plate buried in the pedestal and activates the plasma elements 206. The plasma elements 206 may include multiple bias electrodes to control fluence of high energy ions. Plasma is generated by the plasma source 210 (ICP shown) and electrodes sustained by RF power supply, which can supply an RF signal of the fixed amplitude. The voltage controller 205 may send the signal to the bias RF generator during the addressing period to modify power for any subframe according to a number (area) of activated electrodes, in order to provide the same bias voltage for all subframes, independent of the number of selected elements.

In some embodiments, the number of plasma elements 206 is large and are addressed by the control plate line by line (e.g., scanning) using $(x_i, y_k)$ or i, k coordinates, for example. The plasma elements 206 may be individually addressed or addressed as a group or region, as will be discussed in further embodiments.

Figures 3A, 3B:
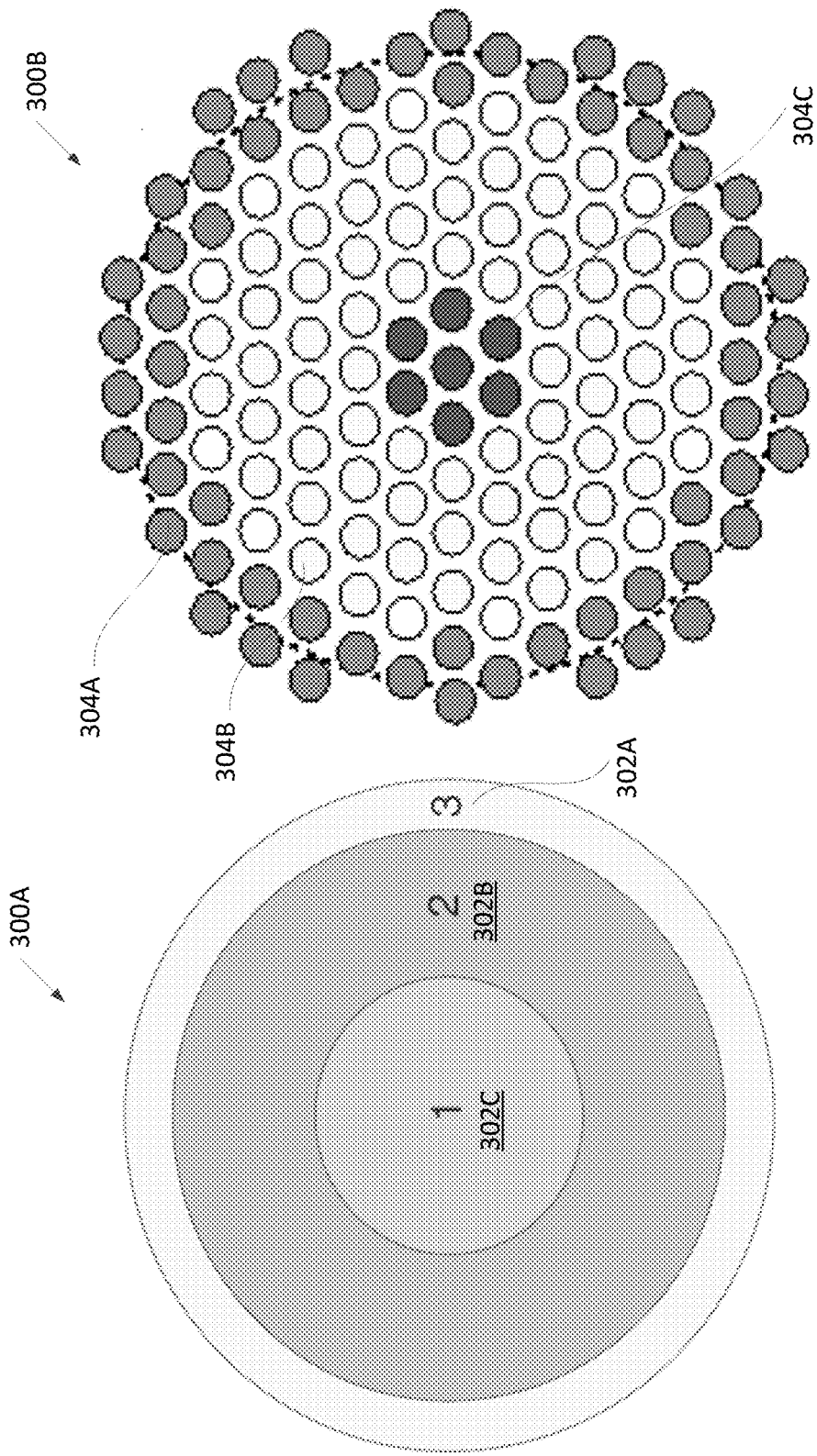
FIGS. 3A-B illustrate digitally controlled plasma elements, according to aspects of the disclosure.

FIGS. 3A-B illustrate a set of digitally controlled plasma elements 300A-B, according to aspects of the disclosure. The set of controlled plasma elements 300A-B may be used in association with or as part of a plasma generating plate (e.g., plate 204 of FIGS. 2A-C). For example, the control may be applied to local plasma generation above adjacent element of the substrate. In another example, the set of controlled plasma elements may be used in combination with a common plasma source (e.g., ICP), but the digital control of the plasma elements is used to control the local fluence (integral of flux over time) of high energy ions to a substrate. For example, the set of plasma elements may include sectional bias electrodes 302A-C. In an analog regime, fluence can be controlled by changing voltage on each of these electrodes (e.g. changing fluxes or ion energy). In a digital regime, voltage remains substantially constant, but different times the bias is applied to each section to alter the fluence. For example, instead of having just a few zones, bias electrode can be pixelated into many (hundreds) small electrodes. The electrodes can be associated (e.g. connected) into a few zones as in previous example 304A-C, and achieve the same result, or control each one of these small electrodes and achieve improved flexibility and control of the process.

The time that the RF voltage (e.g. RF bias voltage) is applied to each electrode or each section of electrodes can be controlled. It should be noted that the applied voltage to each electrode can be independent of the number of active (e.g., ON state) electrodes. In some embodiments, to achieve independent applied voltage, the RF generator 208 may operate in a fixed output voltage mode. If a generator operates in the power control mode, one can supply the RF generator a signal from the control unit to adjust power according to the number of active electrodes.

The time required for driving each of the multiple discharge elements may be calculated and stored in an exposure duration map file (e.g. an "image" file). For example, for the case shown in FIGS. 3A-3B with only 3 zones, the exposure file may include (t(a), t(b), t(c)) representing the exposure duration for each zone. The following is an exemplary method realizing the exposure file for a system with three zones, as previously introduced. Suppose t(a)<t(b)<t(c). The whole panel (all 3 zones) operates for the duration t(a), then zone A is turned OFF and only zones B and C operate for duration of t(b)−t(a), then zone B is turn OFF and only zone C operates for the remaining time t(c)−t(b). Three zones process control allows to achieve a process profile with good radial uniformity. The three sections 302A-C or zones allow for mitigating center-low, center-high, or M-shape and W-shape radial profiles on the substrate. When requirements to the process results is stricter (no local highs/lows, azimuthal uniformity) the necessary number of controlled elements is large, and this simple operation is not efficient. In this case, digital control methodology as presented herein can provide a way of realization. In some embodiments, every element can operate the same way (e.g. same emission rate of plasma related fluxes), but for appropriate time (e.g. exposure duration of the plasma related fluxes).

In some embodiments, while active (ON) discharge cells are connected to the RF source, the inactive (OFF) cells may be grounded or float (i.e. not connected to anything). The plasma related fluxes to the wafer of all species (e.g., ion, electrons, radicals, etc.) are independent on the state of the discharge cells, except high energy ions. In some embodiments, the high energy ions may only be present above the active (on) electrodes.

Alternatively, the elements 304 may represent many plasma shutters (as in FIG. 2B). A plasma source that generates a plasma that emits plasma related fluxes may be disposed proximate the plasma shutters. Each plasma shutter can be designed to switch between an open position and a closed position. While in the open position a plasma shutter may permit the ion and electron fluxes of the plasma to pass through the control plate and while in the closed position the plasma shutters block the plasma related fluxes from passing through the control plate. For example, the plasma shutter may be individually addressed and controlled to selectively open and close to selectively expose a substrate to the plasma related fluxes flowing through the plasma shutters.

In some embodiments, the plasma shutters include multiple electrode layers that perform the opening and closing that permits or blocks ions and electrons from flowing through the plasma shutters (e.g. through a control plate). The plasma shutters may include a first layer of electrodes (e.g. grid facing the plasma) disposed proximate and/or on a side of the plasma source. The first layer of the electrode may be maintained at floating potential. The plasma shutters may include a second layer of electrodes that includes a first ring of electrodes that are maintained at a floating potential when an associated plasma shutter is open and are maintained at a negative potential (reflects electrons) when the associated one of the plurality of plasma shutters is closed. The shutters may include a third layer of electrodes that includes ring electrodes to be maintained at the floating potential when an associated plasma shutter is open and maintained at a positive potential (reflects ions) when the associated plasma shutter is closed.

Figure 4A:
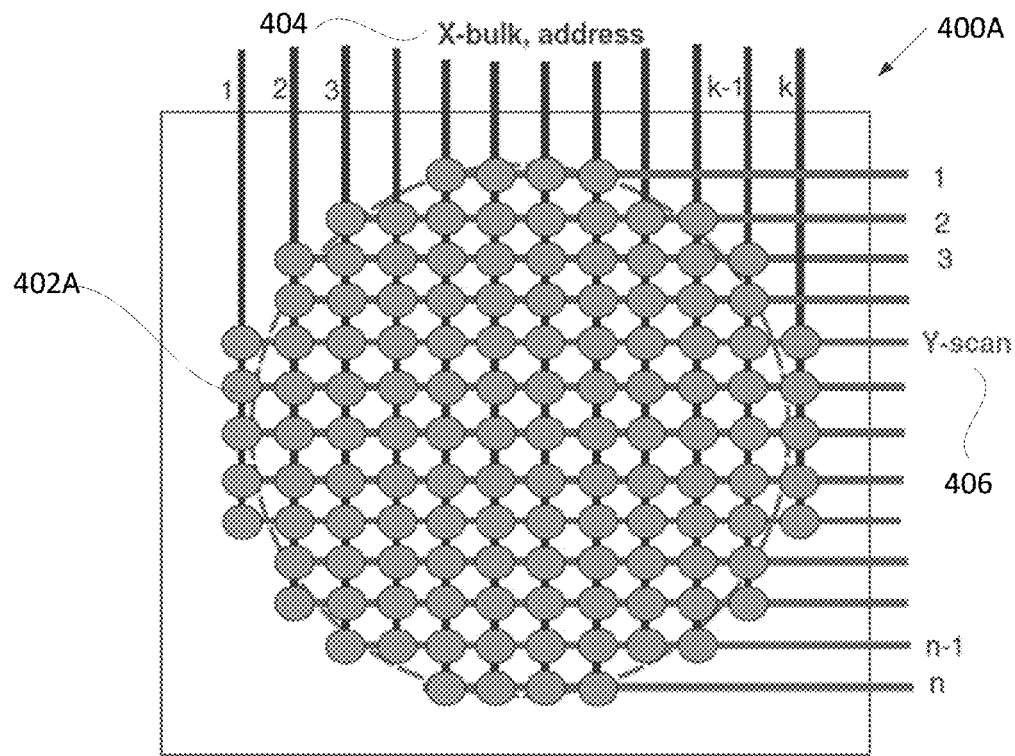
FIGS. 4A-B illustrate addressable plasma elements, according to aspects of the disclosure.
Figure 4B:
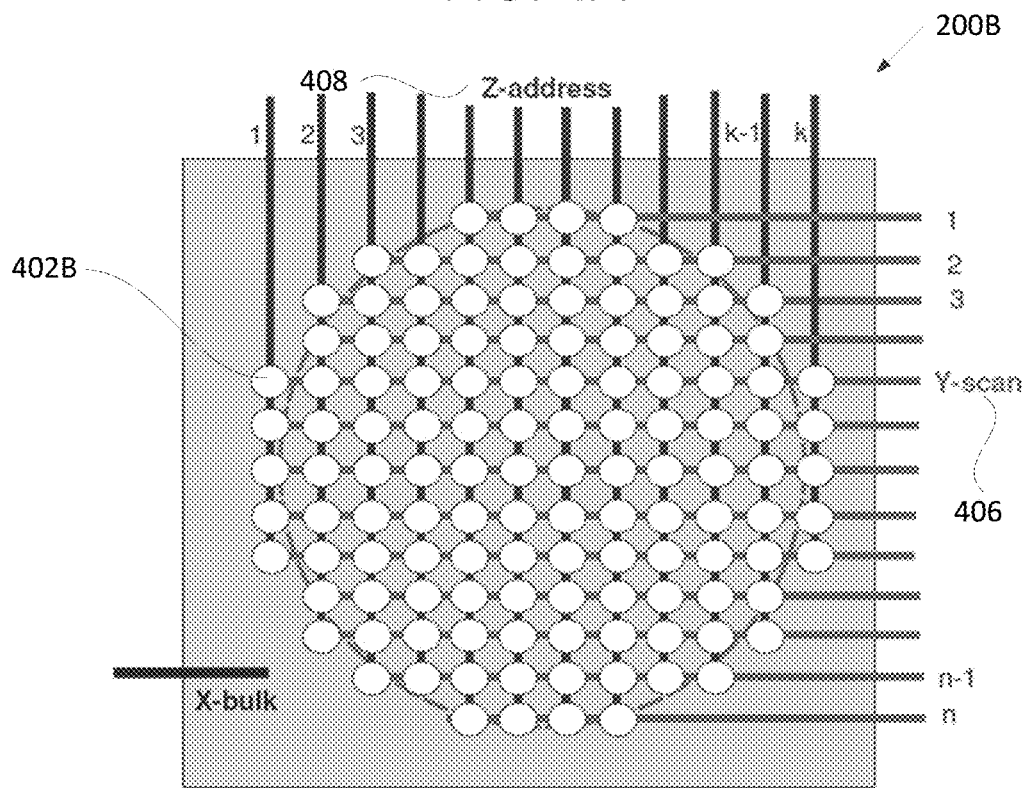

FIGS. 4A-B illustrate a set of addressable plasma elements 400A-B, according to aspects of the disclosure. The addressable plasma elements can use dielectric barrier discharge (DBD) technology, which allows independent operation of each individual cell 402A-B (e.g., mini-source), using selection capability (addressing) of a cell 402A-B (e.g., DBD cell). Alternatively, the addressable plasma elements can include individually addressable shutters, as discussed above. An advantage of dielectric barrier discharge is that a common voltage waveform from a single power supply can be applied simultaneously to all cells 402A-B, but discharges will occur only in previously selected (addressed) cells, which can have natural memory capability without requiring additional memory holding elements. The remaining cells 402A-B will be idle (no discharge). An alternating voltage ($\pm V_s$) at frequency f from a power supply (e.g., AC generator 208 of FIGS. 2A-C) can generate a series of identical discharge pulses of the 2f frequency in those selected cells. A discharge pulse can occur after every change of polarity, and the total amount of plasma related particles (ions, electrons, radicals) generated in any cell is proportional to the number of pulses generated in that cell.

A combination of a few sub-images/subfields of different durations can be used to generate exposure images (sum of sub-images). In some embodiments, exposure images include data having a set of exposure duration mapped to individual plasma elements. The plasma elements may be oriented in a grid with individual activation instructions stored in an exposure image file. As will be discussed further in later embodiments, an exposure image may include exposure duration values in different format (e.g. quantities of time, number of plasma pulses, etc.) that can be mapped to the cells 402A-B such that each cell 402A-B permits passage or generate plasma related element for an associated exposure duration. In some embodiments, for each subfield, a control unit (e.g. control unit 205 of FIG. 2) applies an appropriate sub-image to a control plate (e.g. control plate 204) to address selected cells, which will then be active for the duration of that subfield.

As shown in FIGS. 4A-B, the cells may be disposed in an organized structure (e.g., a grid, a shape, etc.). Each cell 402A-B may be given an address in two dimensional space (X,Y) or (Z,Y). The former uses 2 electrodes structure, so both electrodes are used for both addressing and sustaining. The latter uses 3 electrodes, where additional electrode is used together with Y (scan) electrode only for addressing, and X and Y electrodes are used for sustaining discharge. Both addressing-sustaining schemes can be used to address the electrodes. For example, a cell may be assigned an address with an X address 404 (or a Z address 408) and a Y address 406. In some embodiments, an exposure image (also known as an exposure map) can include a large array $t_{ik}$, or $N_{ik}$, where N is the number of pulses, and (i, k) is a node of the array with $(x_i, y_k)$ coordinate of the (i, k)'s where the address identified in the exposure image corresponds with an address of a cell of the set of plasma elements 400A-B. For example, an address in the image file may contain data indicative of a time duration or exposure duration an associated addressable node (or cell) is to activate during a plasma process.

In some embodiments, to convert exposure image $t_{ik}$ to addressing image, normalization can be used to a process time $t_{pr}$, color, or gray shade as in $$t_{pr} = \max(t_{ik}) \qquad \text{Equation 1}$$

$$\tau_{ik} = \frac{t_{ik}}{t_{pr}} \qquad \text{Equation 2}$$

By multiplying $\tau_{ik}$ by the number of grey levels $N_G$ and taking the integer part of the result (mod 1) yields Grey Level (GL)

$$GL_{ik} = (N_G \tau_{ik}) \bmod 1 \qquad \text{Equation 3}$$

$GL_{ik}$ is the addressing image of the exposure image $\tau_{ik}$. To use it in addressing, $GL_{ik}$ values can be converted into $N_{sf}$-bit numbers, where each bit displays whether the cell is addressed on or off for a particular subfield. For example, for the 8-subfield addressing ($N_{sf}=8$), with each subfield proportional to $2^{k-1}$ starting from 1, the number 01010101 means level 170 (out of 255) and the cell is addressed ON during subfields number 2, 4, 6, 8, and OFF for the rest of the subfields.

Figure 5:
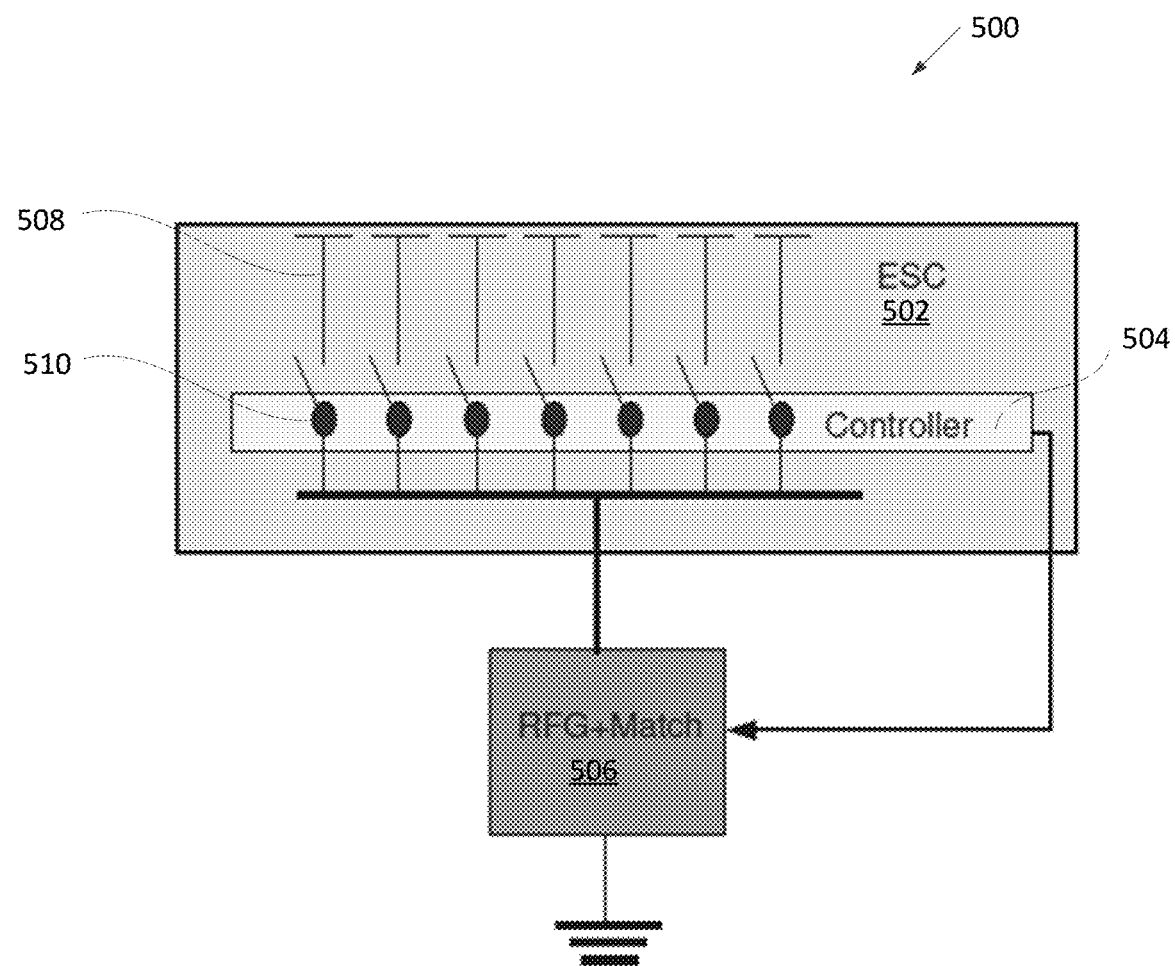
FIG. 5 illustrates a digital process control system, according to aspects of the disclosure.

FIG. 5 illustrates a digital process control system 500, according to aspects of the disclosure. The digital process control system 500 may be used in association with or as a part of a plasma control plate (e.g., control plate 304 of FIG. 3). The digital process control system may control power and/or voltage delivery to digital process elements 508 (e.g. bias electrodes FIG. 3, etc.). Digital process control system 500 may be designed to selectively turn on and off the individual digital process elements 508. The digital process system 500 may include an electrostatic chuck (ESC) 502, a switch controller 504 including a set of switches 510, and an RF generator (RFG) with matching circuitry (also known as a match) 506. The digital process control system 500 may control activation time of digital process elements 508. The activation time of the digital process elements 508 includes energizing any digital process element k (or i, k for two-dimensions (2D)) for a specific time $t_k$ independently of all other elements.

For example, any time $t_k$ (or $t_{ik}$ for 2D array) as a sum $t_k = t_{min} + \Delta t_k$ (or $t_{ik} = t_{min} + \Delta t_{ik}$), where $t_{min}$ is the shortest of all $t_k$ (or $t_{ik}$) and $0 \le \Delta t_k \le \Delta t_{max}$, where $\Delta t_{max} = t_{max} - t_{min}$. This split may allow precise control of time independent of the total time. The time resolution is applied to the relatively short time $\Delta t_{max}$, which is usually much smaller than $t_{max}$. It is convenient to choose precision $\delta t$ with which this time is controlled, so that the difference between any actual $t_k$ is larger than $\delta t$. In this case the potential number of gray scale level, that defines the precision of the time control is $$N_G = \frac{\Delta t_{max}}{\delta t}.$$

Note that $\delta t$ can be used for a brief duration (e.g., as short as a millisecond, or even shorter). This can be achieved by the following embodiments.

In a system having bias electrodes (e.g., electrodes 302A-C and 304A-C of FIGS. 3A-B), where the bias electrodes are driven with a single fixed bias voltage RF generator 506, switch controller 504 may store time values $t_1, t_2, \ldots, t_N$ with resolution $\delta t$ and group the switches (each group has the same time on) and when the time comes, turns off the contact (switches 510) between RF generator 506 and the digital process elements 508. If necessary, the switch controller 504 may send a signal to the RF generator indicating that the power must be reduced by a specific value related to the number of digital process elements turned on or off at that moment. Note that every switch 510 may control a relatively small power/current, if the number of digital process elements is large and the time required to turn off a switch 510 or a group of switches is very short.

In another embodiment, in a system having a Dielectric Barrier Discharge (DBD) based plasma source similar to discharge cell described in associated with FIG. 2, all DBD cells can be driven with exactly the same meander like sustain voltage waveform, but the discharge will be generated only in cells previously selected (addressed). The time can be divided $\Delta t_{max} = t_{max} - t_{min}$ in a number of subfields. For example, with the time length of each subfield $$\frac{\Delta t_{max}}{2^m},$$

where m∈(1, M) is the subfield number, so that combining subfield times can make any time t with precision $$\delta t = \frac{\Delta t_{max}}{2^M}.$$

Erasing all cells (e.g. turning them all off) and then addressing cells between subfield can generate an image for any particular subfield. The whole discharge will contain an "all on" image for time $t_{min}$, followed by M corrective images.

The overall image represents the array $t_{ik}$ for generating discharge in the array source with precision $$\frac{t_{max} - t_{min}}{2^M}.$$

For example, if the total process time is 100 seconds and the maximum correction required for the process is 10 seconds (10%), with only 6 subfield in total (M=5), the precision of the process control will be 0.3 second, or 0.3%.

In some embodiments, the exposure distribution image may be associated with or correspond to a process result image h(k), where colors are assigned based on the relative change of the film thickness, as will be discussed in associated with FIG. 6B.

Figure 6A:
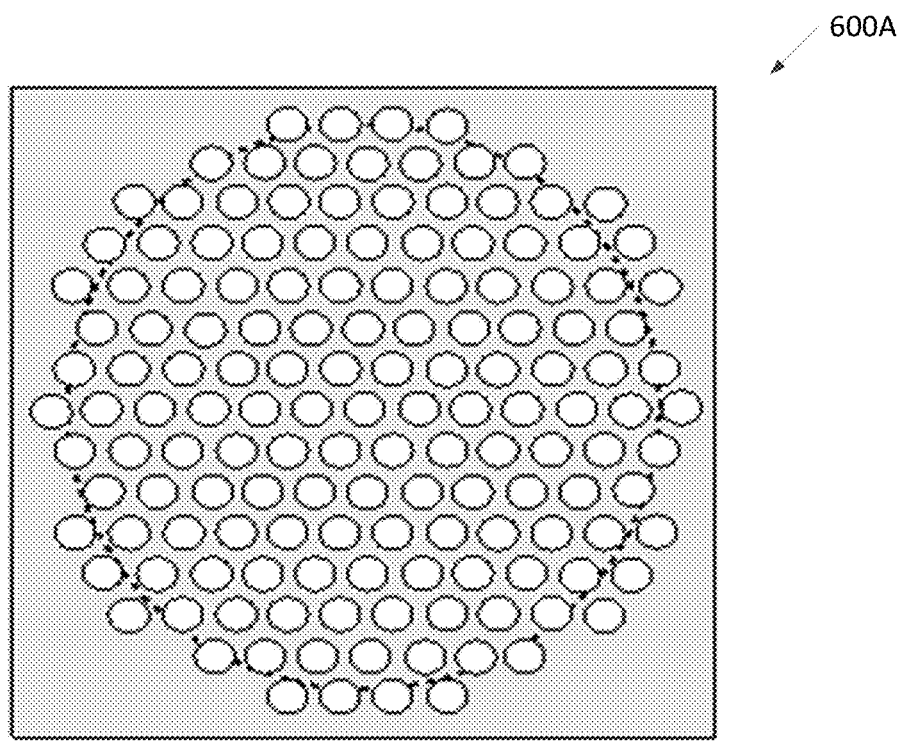
FIG. 6A-E illustrates various processing images, according to aspects of the disclosure
Figure 6B:
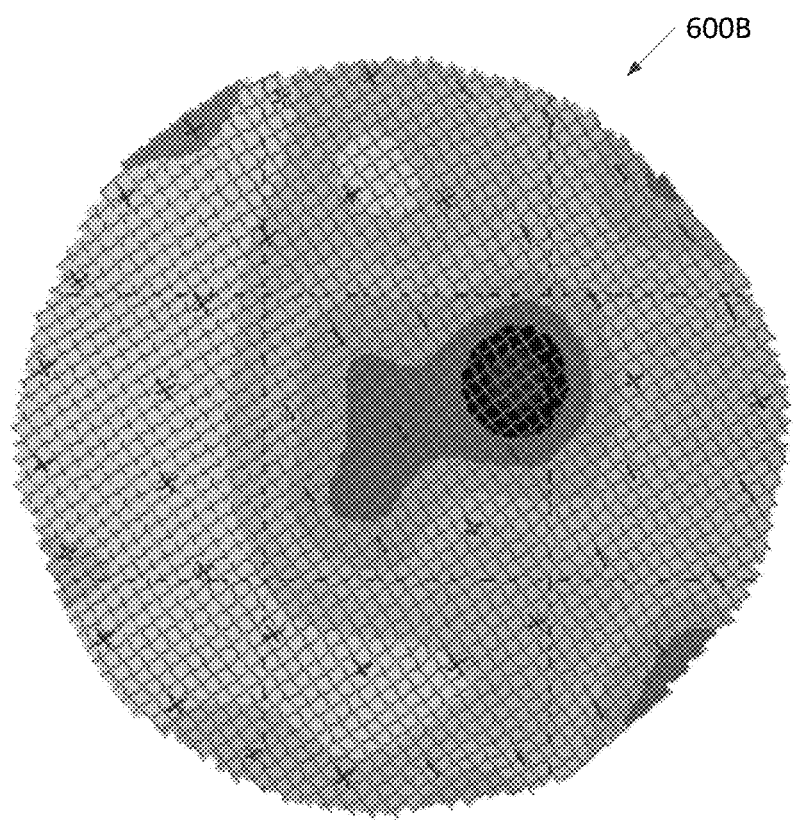
Figure 6C:
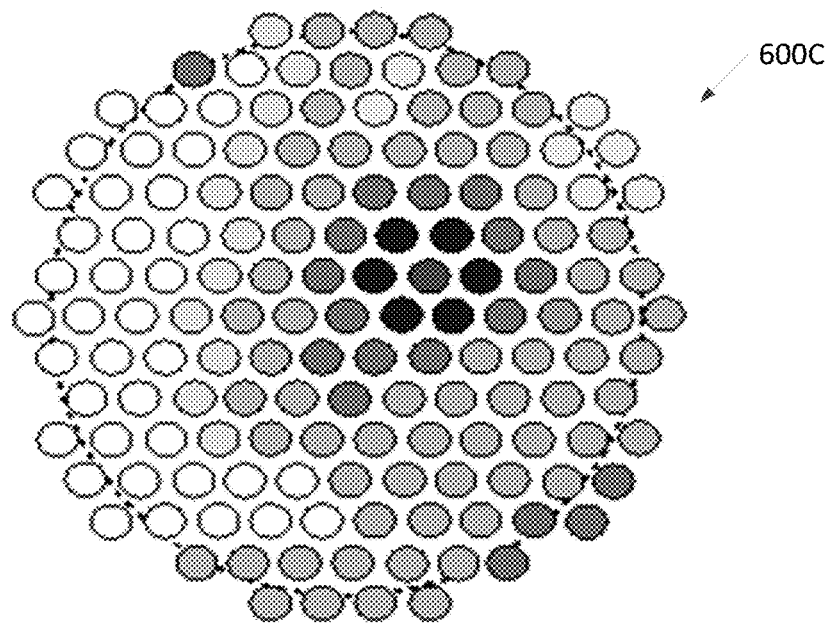
Figure 6D:
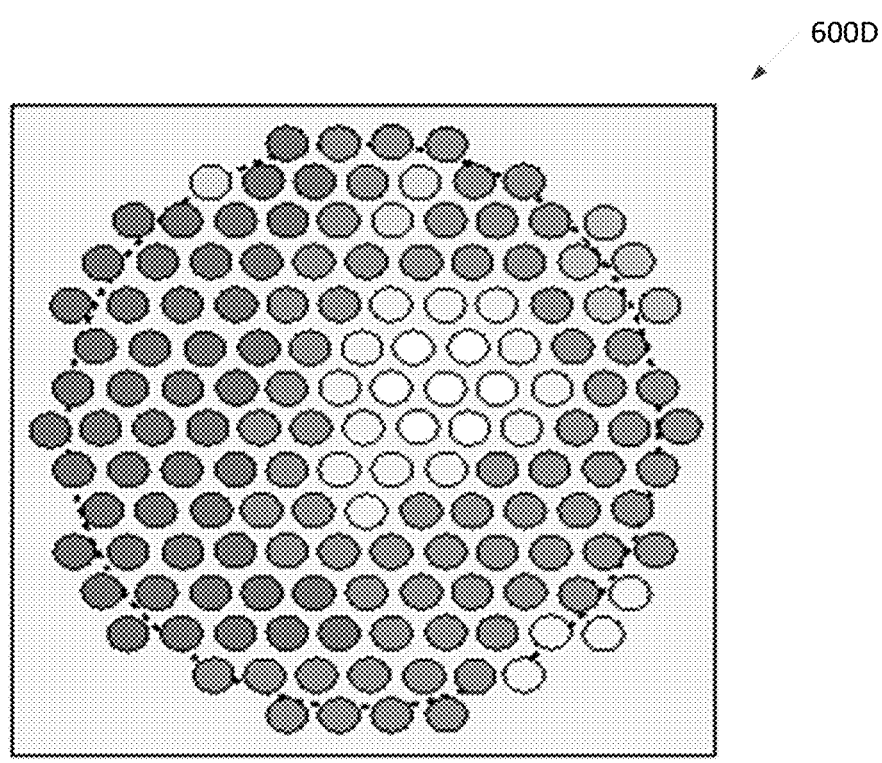
Figure 6E:
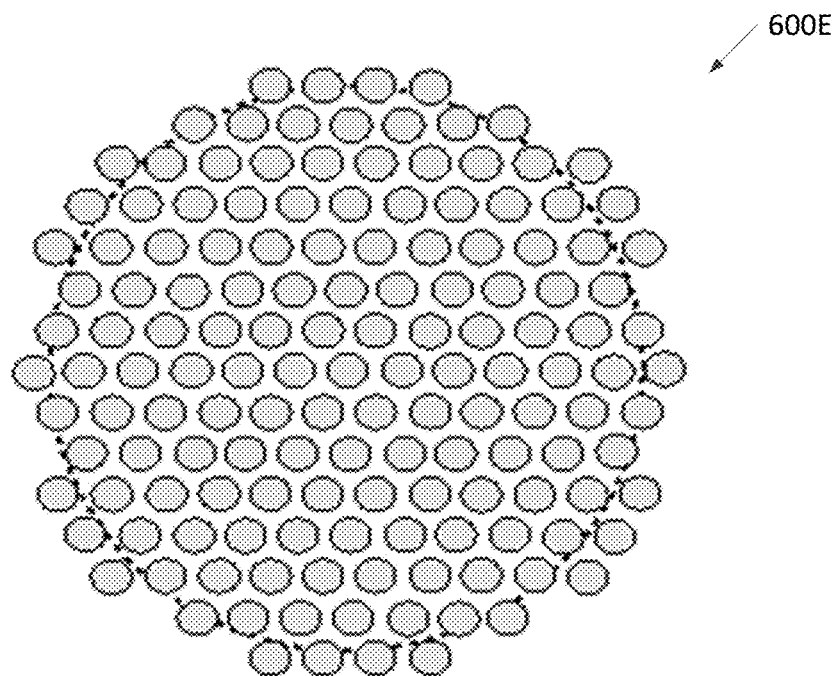

FIG. 6A-E illustrates various images, illustrating a process flow according to aspects of the disclosure. For example, FIG. 6A illustrates an initial choice of a uniform exposure image for achieving a uniform target process image. This image has number of elements equal to the number of controlled elements, which we expect to be large, so we call it High Resolution (HR) exposure image. FIG. 6B illustrates an example of a non-uniform Low Resolution (LR) process image obtained in the result of exposure image 6A, and obtained using metrology tool after the process is complete. Typical number of elements in this LR image is 49, and values in between these measured points are result of interpolation. FIG. 6C illustrate the same LR process image (with e.g. 49 elements) converted to a High Resolution process image (e.g. 1000 elements), where each element has coordinates of the controlled elements. FIG. 6D illustrates a corrected exposure image, obtained using a simple procedure described in this invention. FIG. 6E illustrates a resulting uniform HR process result image.

Typical process results, as shown in FIG. 6B, are indicative of a measured parameter (e.g. such as film thickness of a substrate) change as a result of the process. The parameter can be measured over multiple points (e.g., 49 points). Alternatively, more or less points can be used to measure the parameter. The measured points and their locations may not be related to positions and a number of controlled elements, as shown in FIGS. 6A, 6C, and 6D, that are being addressed. The raw process result image $h_{raw}(x, y) = h_{raw}(k; k=1-49)$, as seen in FIG. 6B, can be converted into a processing image (e.g., FIG. 6C) with sources coordinates $h_{ik} = h(x_i, y_k)$. To perform this conversion, the control unit interpolates $h_{raw}(x, y)$ an area of the process result image, including outside of the wafer, and extracts data $h_{ik}$ related to the source coordinates $(x_i, y_k)$ from this interpolation. This array $h_{ik} = h(x_i, y_k)$ is the process result image (e.g., FIG. 6C or a corrected exposure image FIG. 6D), which a processing unit (e.g. processing unit 207 of FIG. 2) uses for generating the exposure image $t_{ik} = t(x_i, y_k)$ (e.g., FIG. 6E). In some embodiments, the exposure image can include 2D arrays images where any one of them can be represented as product of maximum value (brightness) and the relative value—ratio of the local value to the maximum (a "color" or "shade")

$$h_{ik} = h_{max} \frac{h_{ik}}{h_{max}}, \quad t_{ik} = t_{max} \frac{t_{ik}}{t_{max}}, \quad \text{Equation 4}$$

For example, the data can be illustrated or "painted" by placing a proper color in the positions $(x_i, y_k)$.

In some embodiments, the exposure images can be tuned and improved through image processing. For example, a process can start with a process image obtained from an arbitrary initial exposure distribution image (e.g. FIG. 6C) and then using a standard procedure with a simple numerical algorithm one can correct elements of the exposure image array associated with the process image array. The corrected image (e.g., FIG. 6D) can be applied to obtain a process image (e.g., FIG. 6E) closer to the desired process result (image) (DPI) than the initial image (e.g., FIG. 6B). This can be repeated until the difference between the desired process image (DPI) and actual process image (PI) is satisfactory (e.g. meet a threshold or target thickness profile).

Figure 7A:
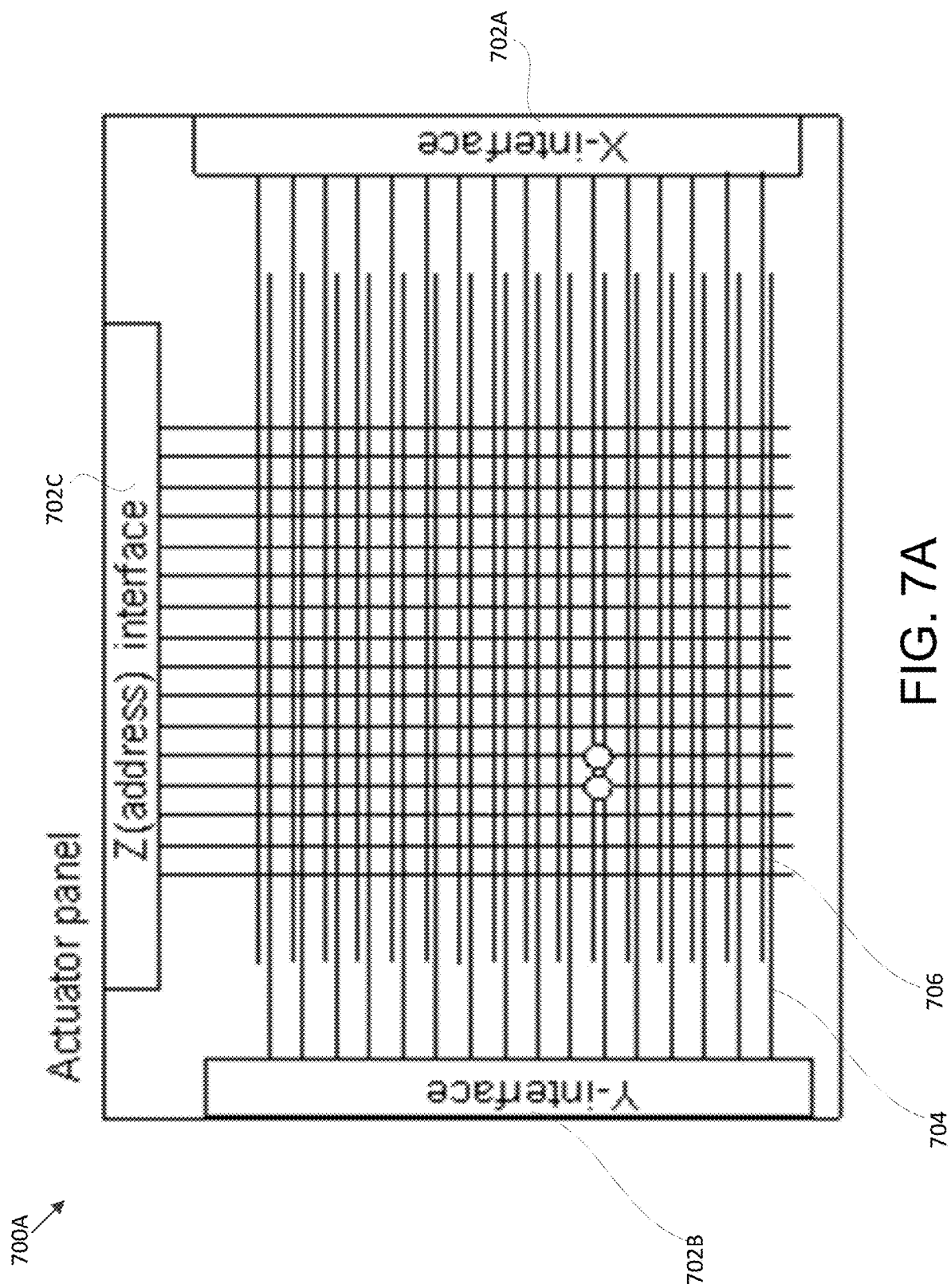
FIG. 7A-C illustrate a digitally controlled plasma processing device, according to aspects of the disclosure
Figure 7B:
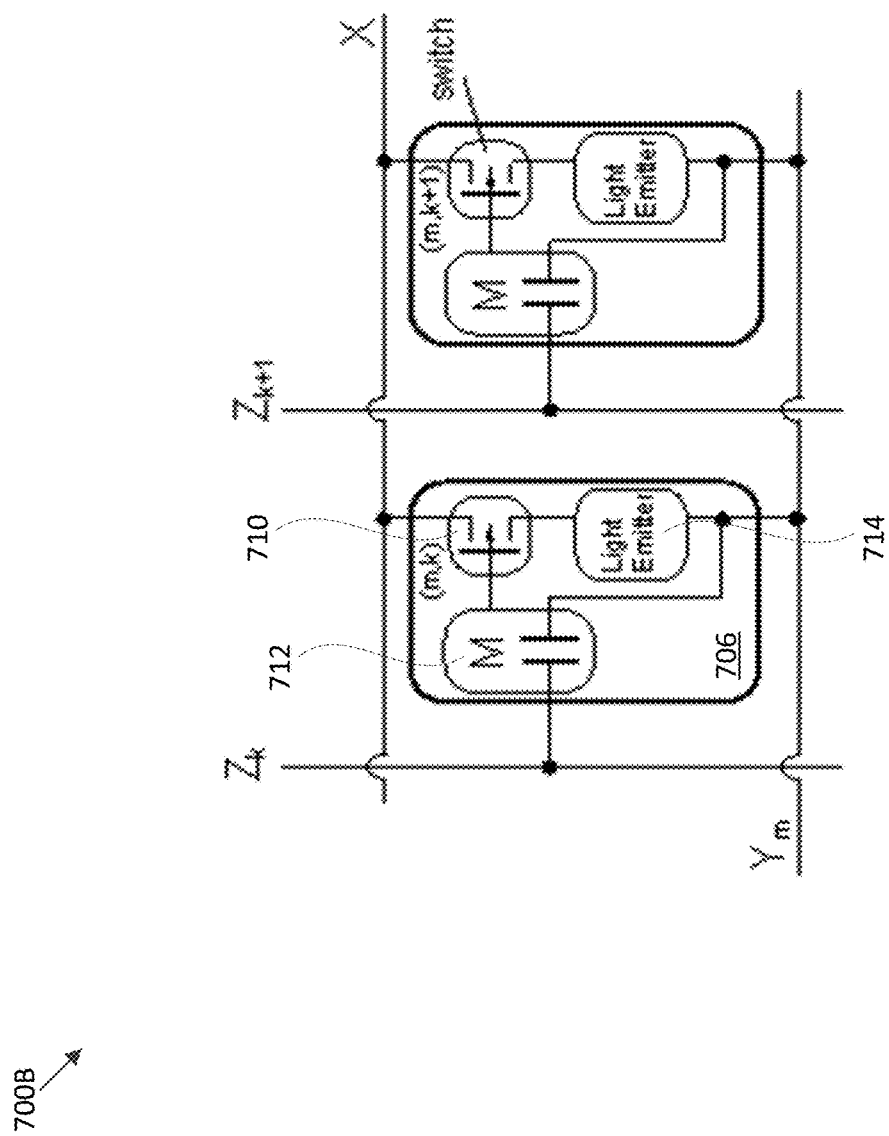
Figure 7C:
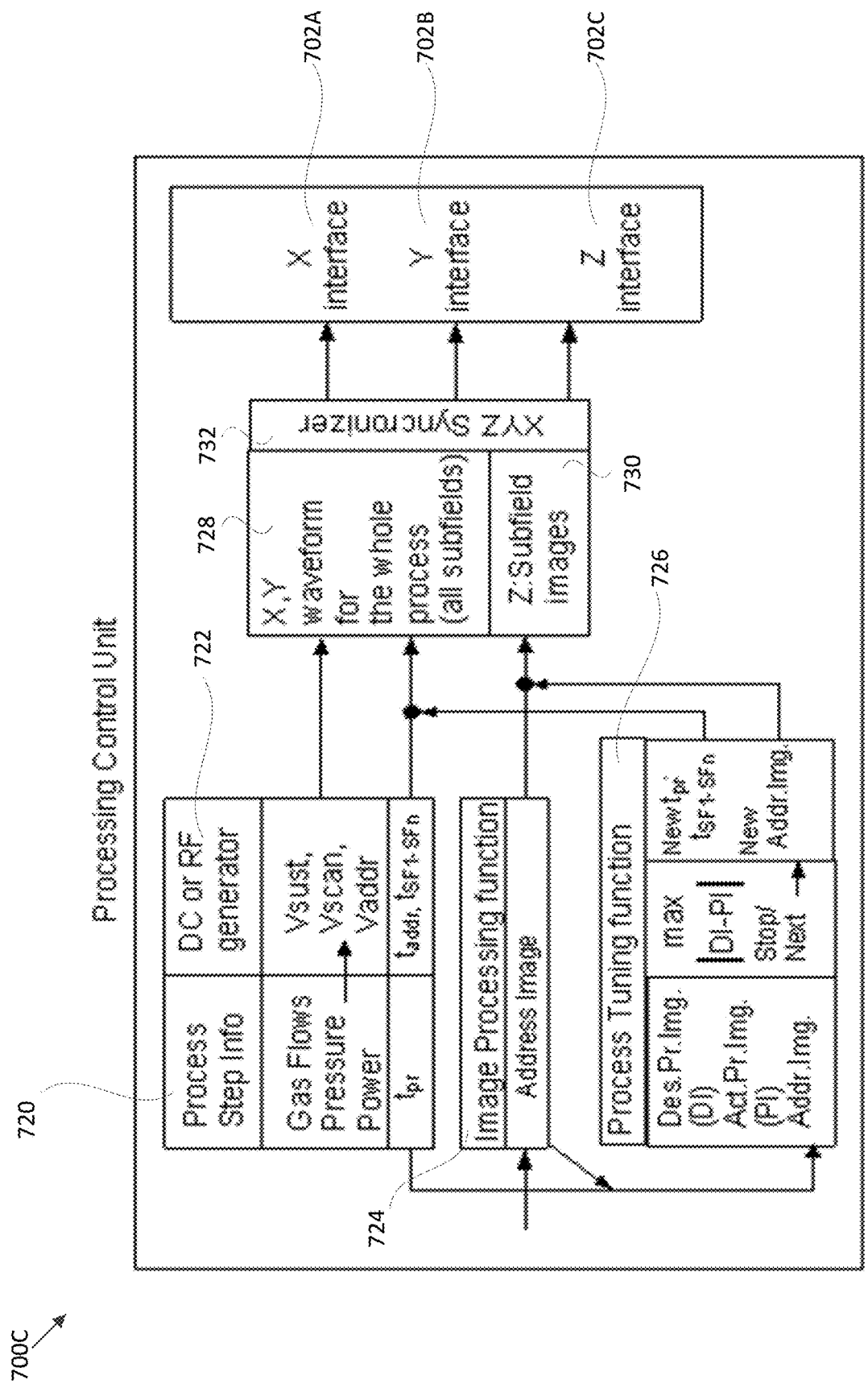

FIG. 7 illustrates a digitally controlled plasma processing device, according to the present disclosure. FIG. 7A illustrates an actuator plate 700A, FIG. 7B depicts a selection of plasma cells 700B, and FIG. 7C depicts a control unit 700C of a digitally controlled plasma processing device. In one embodiment, the plasma processing device depicted in FIGS. 7A-C may include any of the plasma processing systems disclosed in any of FIGS. 1-6. Alternatively, the plasma processing device may be other plasma processing devices, as described herein.

As seen in FIG. 7A, actuator plate 700A includes multiple interfaces 702A-C. For example, three interfaces may be used (e.g. an X-interface 702A, a Y-interface 702B, and a Z-interface 702C). Each interface may include a series of leads (e.g. wires) that are coupled to a set of plasma cells 706 disposed across the actuator panel 700A. It should be noted that the relative orientation of each interface is exemplary, and the role each interface 702A-C carries out is interchangeable with the other interfaces. In some embodiments, a first interface (e.g., Z interface) carries, during an addressing period of a plasma process, an addressing signal to address (e.g. digitally flag, electronically store data) a selection of plasma cells 706 that are to be activated during an upcoming sustain period of the plasma process. A second and third interface (e.g. x interface 702A and y-interface 702B) carry a sustain signal to each of the plasma cells 706 during the sustain period of the plasma process. The addressing signal can be targeted to a selection of cells. In some embodiments, the sustain signal is carried to each plasma cell 706, regardless of whether they have been previously addressed. However, in other embodiments, a selection of cells (e.g. only the addressed cells, "ON" cell) receive a sustain signal.

As shown in FIG. 7B, plasma cells 706 may include an addressable switch (i.e. addressable actuator) 710, a memory element 712, and an emitter 714. In some embodiments, the memory element 712, which may correspond to any combination of volatile and/or non-volatile storage mechanisms, receives an addressing signal (e.g. from Z interface 702C and Y interface 702B) and stores in memory an indication the cell has been addressed (e.g. during and addressing period of a plasma process). The plasma cell 706 can receive a sustain signal (e.g. from X interfaces 702A and Y interface 702B). If the plasma cell 706 had previously been addressed by an addressing signal, the indication in the memory element 712 causes the addressable switch to close. The closing of the addressable switch allows the sustain signal to activate the emitter 714. The emitter may include a light emitter, a plasma generator (e.g. ion or electron fluxes), or a plasma shutter. For example, the emitter 714, when activated, can generate and emits plasma related fluxes.

As shown in FIG. 7C, the process of addressing and sustaining the plasma cells can be carried out by a control unit 700C. Control unit 700C can include one or more processor(s), analyzer(s), and/or circuitry to address and sustain the plasma cell 706. As seen in FIG. 7C, the control unit 700C includes a process step analyzer 720. The process step analyzer 720 receives configuration and/or parameter data for a process step in a plasma process. For example, the process step analyzer can receive gas information (e.g. type of gas, flow rate of gas, pressure of gas, etc.), pressure of the processing chamber, total process time of the process step, energy requirements (e.g. ion energy for bias electrodes). The control unit also includes a generator 722. The generator 722 may include a DC generator and/or and RF generator. The generator 722 coordinates with the process step analyzer 720 to generate a required base signal with required amplitudes (e.g., auxiliary signal required for control or address (e.g. control signals), and other voltage magnitudes and process times to carry out the process step). For example, the process analyzer 720 may determine an addressing voltage, a sustain voltage, a scanning voltage as well as determine how to split a total process time into an addressing duration, a scanning duration, and a sustain duration. In some embodiments, as described in detail in other embodiments, the process step may be performed using multiple subfields. The duration of each subfield may be determined by the process step analyzer 720 and carried out by generator 722.

As shown in FIG. 7C, the control unit 700C includes processing elements (e.g. processors) to carry out an image processing function 724 and a process tuning function 726, as will be discussed in later embodiments (e.g., method 800-1000 of FIGS. 8-10). In some embodiments the image processing function 724, may include generating and addressing image and breaking the addressing image into a series of subfield images to carry out the process step. In some embodiments, the process tuning function 726 coverts actual measured image data (e.g. 49 measured points across a substrate) into a process image with coordinates of plasma elements. The process tuning function may further compare a desired process image with the process image and generate a new addressing image with a new processing time and new subfield information (e.g. the length of each subfield). This new addressing image and associated data may then be used for the next iteration of the process step.

As shown in FIG. 7C, the control unit include drivers 728, 730 and a synchronizer 732. Driver 728 is associated with powering the plasma cell during both the address and sustain period. Driver 730 is associated with powering a selection of plasma cells that are to be addressed based on an addressing image. The synchronizer 732 coordinates the generated signals from each of the driver to carry out the addressing, scanning, and sustaining of the plasma cell 206. As previously described multiple interfaces 702A-C are used to transmit the signal to the plasma cell 206 on the actuator plate 700A. It should be noted that an ON state may be a first voltage level and the OFF state can be a second voltage level. For example, the first voltage level may be greater than the second voltage level. In another example the second voltage level may be ground.

FIGS. 8-12 depict flow diagrams illustrating example methods 800-1200 related to digital plasma process control, in accordance with some implementations of the disclosure. For simplicity of explanation, methods 800-1200 are depicted and described as a series of acts. However, acts in accordance with this disclosure can occur in various orders and/or concurrently and with other acts not presented and described here. Furthermore, not all illustrate acts may be performed to implement the methods 800-1200, in accordance with the disclosure subject matter. In addition, those skilled in the art will understand and appreciate that methods 200-400 could alternatively be represented as a series of interrelated states via a state diagram or events. Methods 800-1200 may be performed, for example, by plasma processing systems 100 or 200 of FIGS. 1-2. At least some operations of methods 800-1200 are controlled and/or implemented by a controller of a process chamber, such as by control unit 700C of FIG. 7C.

Figure 8:
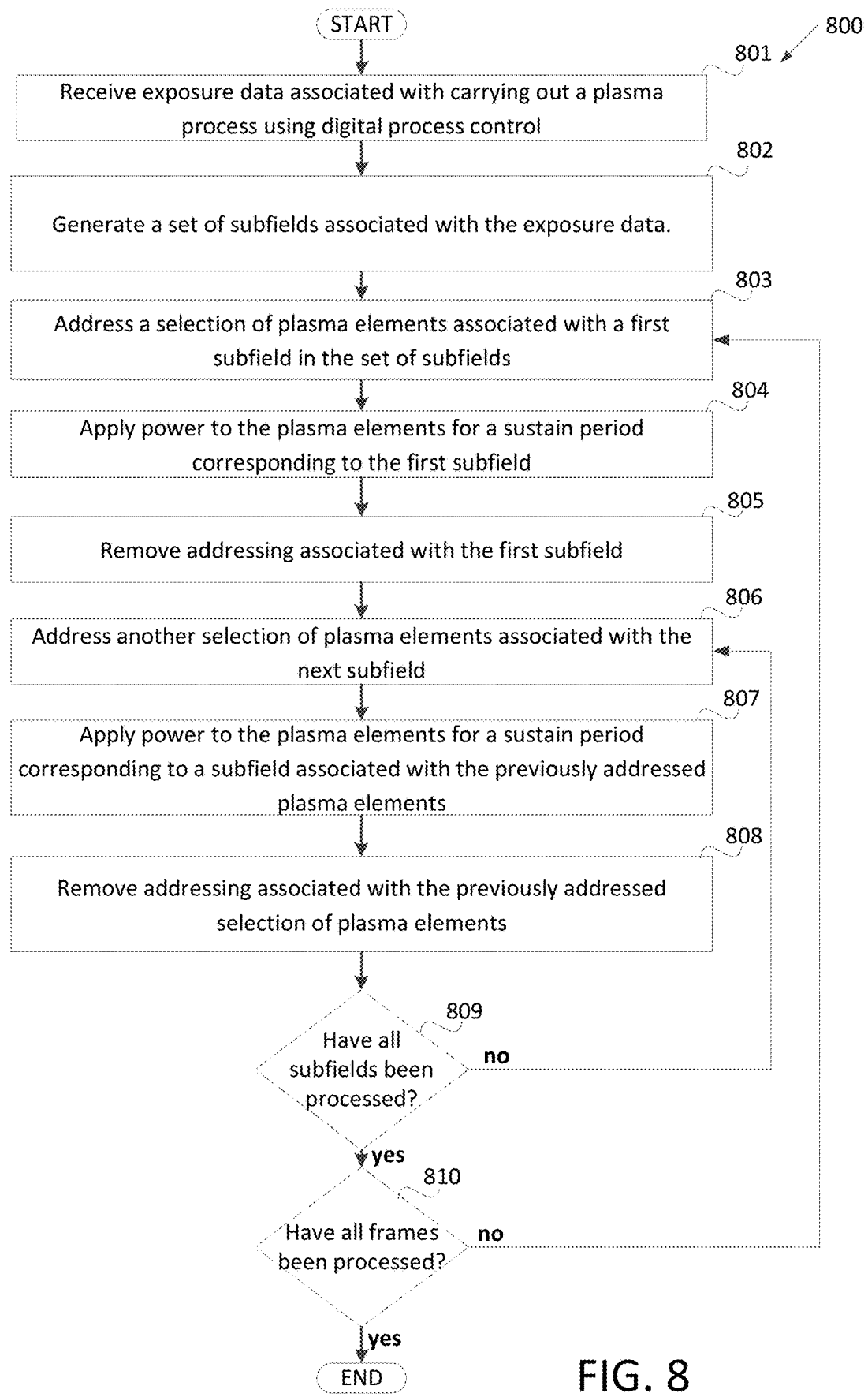
FIG. 8 is a flow chart of a method for plasma delivery, according to aspects of the disclosure.

FIG. 8 is a flow chart of a method 800 for plasma processing, according to aspects of the disclosure. Referring to FIG. 8, at block 801 processing logic receives exposure data associated with carrying out a plasma process using digital process control. The exposure data can be transmitted as an exposure map (e.g. an image file, or an exposure map as discussed in associated with FIG. 6A-B). Alternatively or additionally, the exposure data may include plasma process parameters such as a sustain voltage, an addressing voltage, a total process time, and subfield structure (e.g. a number of subfields and relative processing times), among other things.

At block 802, processing logic generates a set of subfields associated with the exposure data. The subfields can include plasma exposure values each associated with a respective plasma element of a set of plasma elements configured to generate plasma related fluxes. For example, subfields as described in association with FIGS. 1A-C can be used to divide a total process time into frames and/or subframes.

At block 803, processing logic addresses a selection of plasma elements associated with a first subfield of the set of subfields. In some embodiments, addressing techniques as described in associated with FIGS. 7A-C can be used to address the selection of plasma elements. For example, as discussed in associated with FIGS. 7A-C, the plasma elements may include a memory element (e.g. memory element 712 of FIG. 7B) that is capable of storing data capable of closing a switch that activates an emitter, responsive to receiving a sustain voltage.

At block 804, processing logic applies power to the plasma elements for a sustain period corresponding to the first subfield. The sustain period can include a time duration where a constant voltage (e.g. a sustain voltage) is applied to each of the plasma elements. For example, as discussed in associated with FIG. 7B, during a sustain period all of the plasma elements are supplied with the same sustain voltage and those cells that have previously been addressed (e.g. data stored in a memory element) drive and activate the element (e.g. light emitter, a plasma emitter, a plasma shutter, etc.). For example, a resulting process image created from a selection of plasma emitter increases in "brightness" (e.g. thickness change) as the sustain duration increases.

At block 805, processing logic removes (e.g. erases) addressing associated with the first subfield. All of the plasma elements that have previously been addressed can be cleared of any addressable data (e.g. clearing any charge and/or data stored in memory elements 712).

At block 806, processing logic addresses another selection of plasma elements associated with the next subfield. As previously discussed, addressing techniques, as described in associated with FIGS. 7A-C can be used to address this next selection of plasma elements similar to the implementation of the processing logic at block 803.

At block 807, processing logic applies power the plasma elements for a sustain period corresponding to a subfield associated with the previously addressed plasma elements. As discussed previously, the sustain period can include a time duration where a constant voltage (e.g. a sustain voltage) is applied to each of the plasma elements. For example, as discussed in associated with FIG. 7B, during a sustain period all of the plasma elements are supplied with the sustain voltage and those cells that have previously been addressed (e.g. data stored in a memory element) drive and activation element (e.g. light emitter, a plasma emitter, a plasma shutter, etc.). For example, a resulting process image created from a selection of plasma emitter increases in "brightness" (e.g. thickness) as the sustain duration increases.

At block 808, processing logic removes addressing associated with the previously addressed selection of plasma elements. All of the plasma elements that have previously been addressed can be cleared of any addressable data (e.g. clearing any charge and/or data stored in memory elements 712), as similarly implemented at block 805.

At block 809, processing logic determines whether all subfields in the set of subfields have been processed. Responsive to determining that all subfields have been processed, processing logic proceeds along the yes path to block 810. Responsive to determining that the all subfields in the set of subfields have not been process, processing logic proceeds along the no path to block 806 and proceeds with addressing a selection of cells associated with the next subfield.

At block 810, processing logic determine whether all frames have been processed. Responsive to determining that all frames have been processed, processing logic proceeds along the yes path and ends. Responsive to determining that all frames have not been processed, processing logic proceeds along the no path to block 803 and proceeds with processing the next frame. In some embodiments this process is repeated for until all subfields have been process, however, in other embodiments the process continues until an end condition of the plasma process is met (e.g. a process result meets a threshold criterion).

In some embodiments, the method 800 is repeated many times (M), using frames, gradually making the images (both exposure and process images) "brighter." Each frame uses the same image ($t_1\tau_{ik}$) resulting in the same normalized process image as $H_{ik}$, but the "brightness" $h_{ik}$ grows with the number of frames until it reaches $H_{ik}$. The process time is the sum of the displaying a single frame $t_1$, $T=Mt_1$. For example, for a uniform desired process image (DPI), $H_{ik}=H=$const, the single frame process image $h_{ik}$ will also be uniform, and time will increase the "brightness"/thickness of the same image.

In another embodiment, the exposure image is displayed only once, but the whole process time is divided based on the proper number of subfields and each subfield is effectively M times longer than the appropriate subfield in the previous embodiment. In this embodiment, some areas reach $H_{ik}$ earlier, and then stop, while the other areas are still processed until the whole image reach desired brightness/thickness values. For example, for a uniform DPI $H_{ik}=H=$const, the image will not be uniform until the very end, when area one by one stop changing their brightness until the last one reaches the same value.

Figure 9:
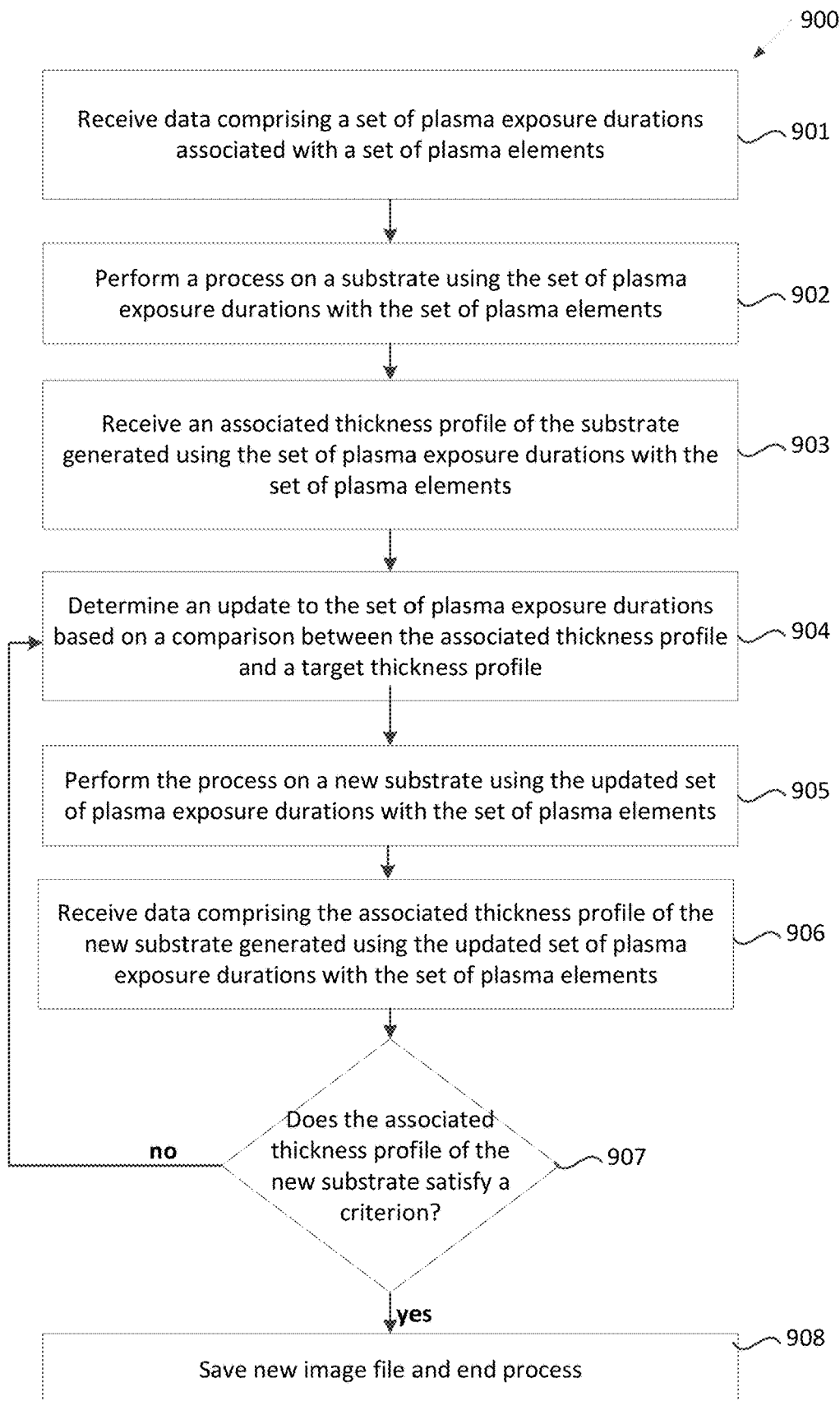
FIG. 9 is a flow chart of a method for tuning a plasma process, according to aspects of the disclosure.

FIG. 9 is a flow chart of a method 900 for tuning a plasma process, according to aspects of the disclosure. Referring to FIG. 9, at block 901, processing logic receives data including a set of plasma exposure durations associated with a set of plasma elements. In some embodiments, the data is received in the form of an exposure image comprising "brightness" values that correspond with exposure duration for each of the plasma elements. For example, the plasma elements can be represented as nodes (i, k) indicative of their relative location to each other and the exposure image may comprises values (e.g. depicted as color or varying degrees of brightness) that map to individual plasma elements and correspond to a total exposure duration for each plasma elements.

At block 902, processing logic performs a process on a substrate using a set of plasma exposure durations with the set of plasma elements. The plasma elements may be configured to generate plasma related fluxes. In some embodiments, the set of plasma exposure durations include an amount of time $t_{ik}$ an associated plasma element exposes the first substrate to the plasma related fluxes generated by the associated plasma elements. In other embodiments, the first data further include a process time duration indicative of a total amount of time to perform a substrate process operation on the first substrate. Any of the set of plasma exposure durations may include a percentage value of the process time duration. In some embodiments, the set of plasma exposure duration include a quantity of plasma pulses $N_{ik}$ an associated plasma element (i, k) exposes the first substrate to during a plasma process. In some embodiments, as described in detail in association with other figures (e.g., FIG. 9), the substrate processing may be performed in a single frame or multiple frames having a varying number of subfields.

As previously noted, in some embodiments, the first data may be stored as an image file (e.g., $\dot{h}_{ik} \equiv \delta h_{ik}/\delta t$). The set of plasma exposure durations may be stored as an array or map having at least one of brightness value or color values indicative of the exposure duration. Processing the data may include converting the image file to and addressing image. For example, the color map may be indicative of the general exposure that get converted to an addressing image or data that is mapped to show individual exposure duration of the set of plasma elements. This data can be stored as an entire frame or divided into subfields and addressed, sustained, and erased (e.g. as described in method 800 of FIG. 8).

In some embodiments, the data received is in the form of an exposure image, t(x, y) on a substrate through an image file or exposure map. For example, for digitally controlled multiple sources/plasma elements the process result thickness (growth film, etch depth, etc.) is a function of space and time $h(x_i, y_k, t) \equiv h_{ik}(t)$, where $t=t(i, k)=t_{ik}$ is the ON time for the source positioned in the (i, k) node. Using file $\dot{h}_{ik}=dh_{ik}/dt$ and the fact that $$\frac{\delta |h|}{\delta t} > 0,$$

the exposure time $t_{ik}$ can be adjusted in every node (i, k) to achieve the process profile $h_0(x, y)$. This time $t_{ik}$ is an exposure image that can constitute the data to be received at block 901.

At block 903, processing logic receives data comprising the set of plasma exposure durations and the associated thickness profile of the substrate generated using the set of plasma exposure durations with the set of plasma elements. In some embodiments, the thickness profile may include a thickness of a film taken in a few points measured across the substrate (e.g. 49 locations across the substrate). The thickness profile may then be extrapolated to represent the thickness across the surface of the substrate in areas not disposed away from the measured locations. The thickness profile, or on-wafer result image, can include the process result (e.g. thickness of grown film, etch depth, etc.) as a function of coordinate h(r) interpolated to positions of the plasma elements (e.g. plasma mini-sources) $r_{ik}$:$h(r_{ik})=h(x_1, y_k) \equiv h_{ik}$. Independently of the position and number of actual measurement points, the dimension and coordinate of the process image array are the same as of the exposure image array $t(r_{ik})=t_{ik}$.

The thickness $h_{ik}(t)$ around a plasma element (also known as a node) grows with time on (or number of pulses in DBD) in that node (i, k) to achieve the desired process image (DPI) H(x, y). The time $t_{ik}$ is the addressing image we are looking for to obtain the on-wafer image $h_{ik}=H_{ik}$.

At block 904, processing logic determines an update to the set of plasma exposure durations based on a comparison between the associated thickness profile and a target thickness profile. For example, a comparison can be drawn between the thickness profile $h_{ik}=k(t_{ik})$ with and the target thickness profile or DPI $H_{ik}$. Updates to various time durations $t_{ik}$ or quantity of plasma pulses $N_{ik}$ can be updated for the individual plasma elements (i, k).

At block 905, processing logic performs the process on a new substrate using the updated set of plasma exposure durations with the set of plasma elements. In some embodiments, the process may be performed using the same equipment (e.g. plasma elements) with only the exposure durations changed.

At block 906, processing logic receives data including the associated thickness profile of the new substrate generated using the updated set of plasma exposure durations with the set of plasma elements. The thickness profile receive in block 906 may include the same features as the thickness profile received in block 903.

At block 907, processing logic determines whether the associated thickness profile of the new substrate satisfies a criterion. Responsive to determining that the associated thickness profile of the new substrate profile does satisfy a criterion, processing logic proceeds along the yes path to block 908. Responsive to determining that the associated thickness profile of the new substrate profile does not satisfy a criterion, processing logic proceeds along the no path to block 904. In some embodiments, the thickness profile $h_{ik}$ may satisfy the threshold criterion when the difference between $h_{ik}$ and desired process image (DPI) ($H_{ik}$) is within a threshold criterion. For example, each thickness value of the profile may be within a predetermined difference limits, process control limit, and/or statistical boundary.

At block 908, processing logic save (e.g., stores locally) the new image file and ends the process.

In some embodiments, tuning is used for updating the total time (e.g. brightness) of the same image, in some embodiments tuning is used to update the image, keeping the same total time, and in some embodiments, both the total time and image may be updated. For example tuning the total time or updating the image may be used to update a process that is partially developed or stable. For example, updating a portion of the data (e.g. brightness or image file) may apply fine adjusting such as accounting for slow process drift during normal fabrication operations. In this embodiments, a test wafer can be used.

In some embodiments, measuring of the substrate (e.g. determine the thickness profiles that are received at blocks 903 and 905) may be performed after a processing step is completed. For example the process result (e.g., thickness profile change) may be ascertained outside of a processing chamber or location proximate a plasma source. However, in other embodiments techniques for in-situ process development can be used to make on-demand adjustments to a fabrication process. For example, a specific location on a substrate may be monitored live to actively determine any process updates to meet a desired outcome (e.g. process image) at the monitored location of the substrate.

In some embodiments the initial address image is unknown, thus the total process time $t_{pr}$ is unknown. A uniform address image ($t(i, k)=t_{pr}$) can be used as a starting point (e.g. at block 901 and 902).

Figure 10:
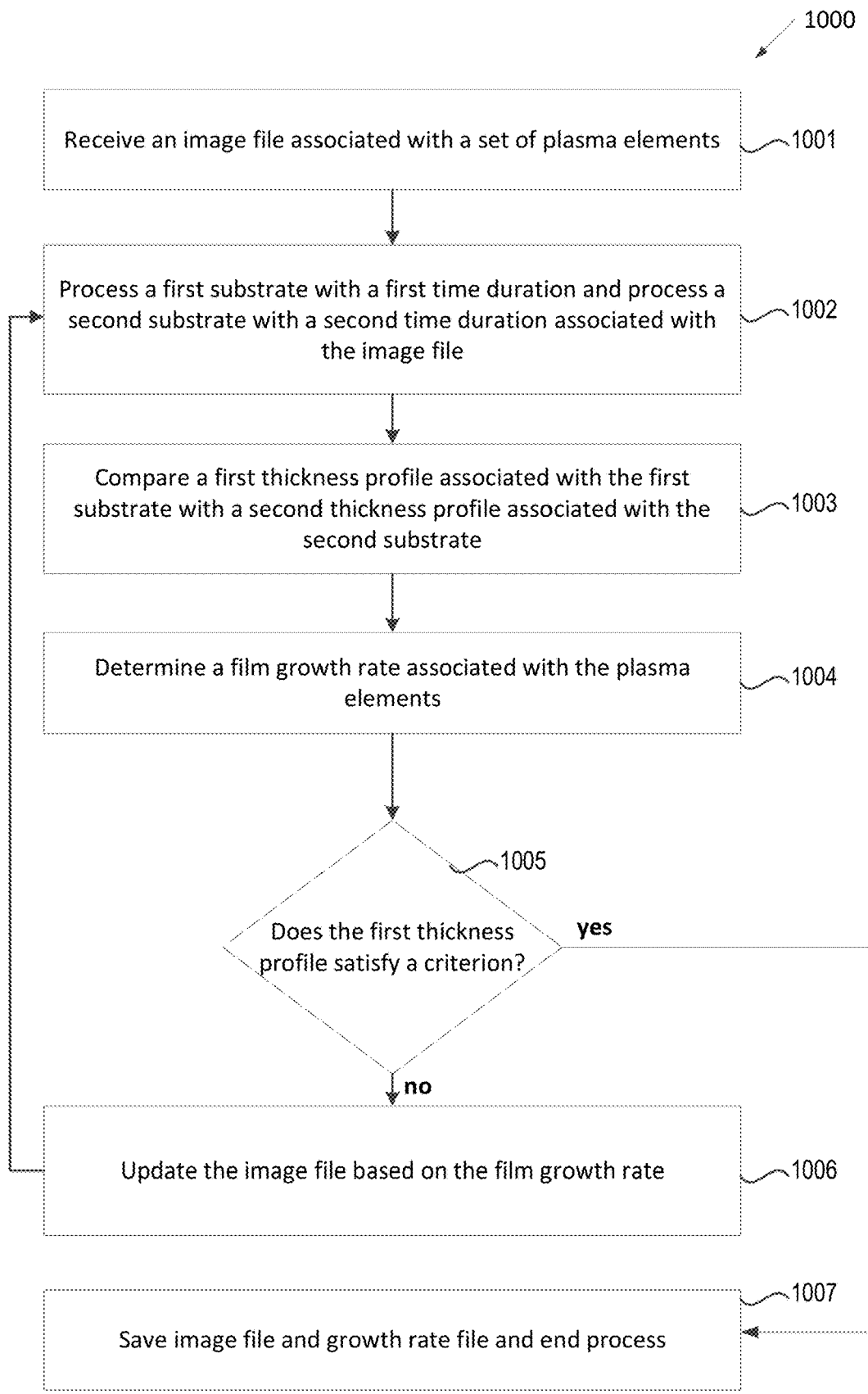
FIG. 10 is a flow chart of a method for tuning a plasma process, according to aspects of the disclosure.

FIG. 10 is a flow chart of a method 1000 for tuning a plasma process, according to aspects of the disclosure. Method 1000 may include, generally, processing multiple wafers (e.g., two wafers at a time) using a variety of time durations and drawing a comparison between the resulting thicknesses determine a rate of thickness value change for one or more processing locations on a first substrate and a second substrate based on the. A modification to the processing instructions (e.g., image file) can be determined based on the rate of the thickness value change. For example, modifying of the first data may be responsive to determining that the rate of thickness value change of one or more processing locations meets a threshold value.

The following embodiment is an example process of using method 1000 to tune plasma exposure duration (e.g. an exposure image). At block 1001, processing logic receives an arbitrary initial image file $t_{ik}=t_{ik}^0$. At block 1002, processing logic processes two substrates (e.g. wafers)—one with time $t_{ik}$, and the other with time $t_{ik}+\delta t$. In some embodiments, the initial image $t_{ik}^0$. can be a simple uniform image (e.g. a uniform grey image) where all elements are the same, or created previously for a similar process, and $\delta t$ (e.g. an update to the set of plasma exposure durations) can be the same for every node and should be a few percent of the process $t_{pr}$.

At block 1003, processing logic compares a first thickness profile associated with the first substrate with a second thickness profile associated with the second substrate. In some embodiments, the thickness profile can be represented generally as process images (e.g. a mapping of the thickness across each substrate). For example, the process images on these wafer can be represented as:

$$h_{ik}=h_{ik}(t_{ik}) \qquad \text{Equation 5}$$

and $$h_{ik}(t_{ik}+\delta t)=h_{ik}+\delta h_{ik} \qquad \text{Equation 6}$$

At block 1004, processing logic determines a film growth rate (or more generally a rate of thickness value change). The film growth rate can be associated with the plasma elements (e.g. disposition of the elements, type of elements, processing chamber parameters, etc.). For example, using the Equations 5 and 6, the following growth rate file (array) can be obtained using the following:

$$\dot{h}_{ik} = \frac{\delta h_{ik}}{\delta t} \qquad \text{Equation 7}$$

A comparison can be drawn between the thickness profile $h_{ik}=h(t_{ik})$ with the target thickness profile or DPI $H_{ik}$ (e.g. at block 1003).

At block 1005, processing logic determines whether the first thickness profile of the associated substrate satisfies a criterion. Responsive to determining that the associated thickness profile of the new substrate profile does satisfy a criterion, processing logic proceeds along the yes path to block 1007. Responsive to determining that the associated thickness profile of the new substrate profile does not satisfy a criterion, processing logic proceeds along the no path to block 1006. In some embodiments, the thickness profile $h_{ik}$ may satisfy the threshold criterion when the difference between $h_{ik}$ and desired process image (DPI) ($H_{ik}$) is within a threshold criterion. For example, each thickness value of the profile may be within a predetermined difference limits, process control limit, and/or statistical boundary.

At block 1006, processing logic updates the image file based on the film growth rate. Updating the image file may include updating the set of plasma exposure duration. Updating the set of plasma exposure durations may include correcting the initial process image using the following:

$$t_{ik} \to t_{ik} + \frac{H_{ik} - h_{ik}}{\dot{h}_{ik}} = t_{ik} + \frac{H_{ik} - h_{ik}}{\delta h_{ik}} \delta t \qquad \text{Equation 8}$$

And repeating the image processing procedures (e.g. blocks 1002, 1003, 1004):

$$t_{ik} \to h_{ik}, \dot{h}_{ik} \to \text{CHECK} \to \delta t(i,k) \to t(i,k)$$

until the difference between $h_{ik}$ and DPI ($H_{ik}$) is within a threshold criterion (e.g. at block 1005).

At block 1007, processing logic save the image file and/or growth rate file and ends the process.

Figure 11:
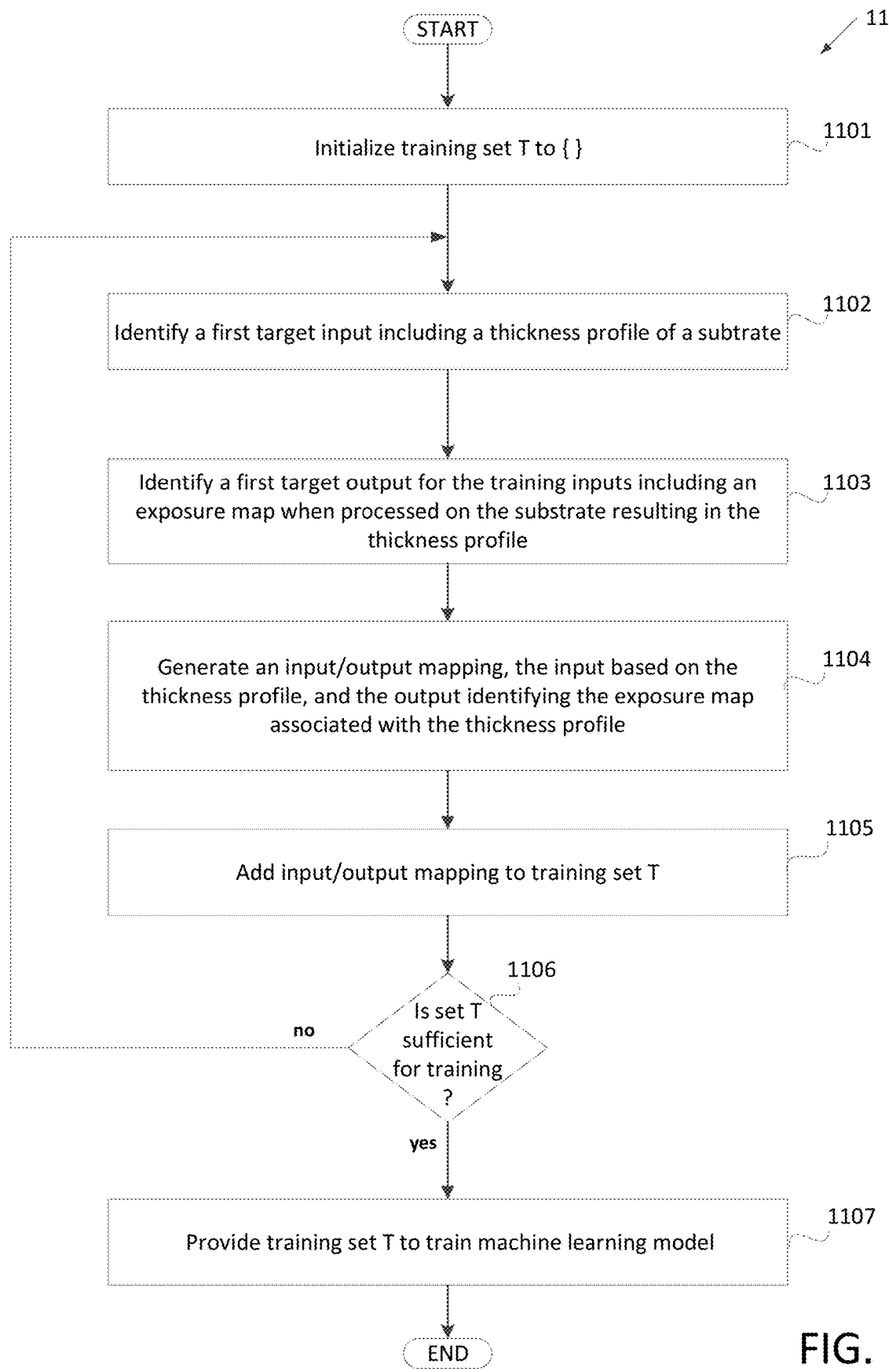
FIG. 11 is an exemplary illustration of a training phase of a machine learning model, according to aspects of the disclosure.

FIG. 11 is an exemplary illustration of a training phase of a machine learning model, according to aspects of the disclosure. A system such as a machine learning system may use method 1000 to at least one of train, validate, or test a machine learning model, in accordance with embodiments of the disclosure. In some embodiments, one or more operations of method 1000 may be performed by a data set generator of a computing device (e.g., computing device 730 of FIG. 7). It may be noted that components described with respect to FIG. 1-7 may be used to illustrate aspects of FIG. 11. In some embodiments, machine learning is performed to determine the interaction between plasma elements of a digital plasma system and how changes in how long a particular plasma element is active (or open) affects both a region of a substrate that is associated with that particular plasma element as well as regions of the substrate that are proximate to the region associated with the particular plasma element. For example, the ON time for a plasma element may most strongly impact a region of a substrate that is directly under that plasma element. However, the ON time for that plasma element may also affect regions that are not directly under the plasma element but that are around the region that is directly under the plasma element. As a result, increasing or decreasing the ON time for a particular plasma element has effects on multiple regions of a substrate. Thus, when a first plasma element ON time is reduced to lower an amount of plasma flux that reaches a particular region, this may also reduce the amount of plasma flux that reaches surrounding regions, and thus it may be appropriate to also increase the ON time for one or more other plasma elements associated with the surrounding regions. However, such change in those plasma elements may increase a flux on still other regions, which may warrant changing the ON time of still other plasma elements associated with those regions. Accordingly, in embodiments a model is generated that can be used to determine what adjustments to make to a recipe run on a particular process chamber based on a thickness profile of a substrate processed on the process chamber.

Referring to FIG. 11, in some embodiments, at block 1101 the processing logic implements method 1100 and initializes a training set T to an empty set.

At block 1102, processing logic identifies a first data input (e.g. first training input, first validating input) that includes a thickness profile of a substrate. The first data input may include a thickness profile including one or more thickness values of film on a substrate measured at various location across a surface of the substrate.

At block 1103, processing logic identifies a first target output for one or more of the data inputs (e.g., first data input). The first target output includes an exposure map (e.g. image file or exposure duration data) that when processed by a plasma delivery system results in the thickness profile used as the first target input.

At block 1104, processing logic optionally generates mapping data that is indicative of an input/output mapping. The input/output mapping (or mapping data) may refer to the data input (e.g., one or more of the data inputs described herein), the target output for the data input (e.g. one or more of the data inputs described herein), the target output for the data (e.g. where the target output identifies an exposure map and/or image), and an association between the data input(s) and the target output.

At block 1105, processing logic adds the mapping data generated at block 1104 to data set T.

At block 1106, processing logic branches based on whether the data set T is sufficient for at least one of training, validating, or testing a machine learning model. If so ("yes" branch), execution proceeds to block 1107, otherwise ("no" branch), execution continues back at block 1102. It should be noted that in some embodiments, the sufficiency of data set T may be determined based simply on the number of input/output mappings and/or the number of labeled exposure maps in the data set, while in some other embodiments, the sufficiency of data set T may be determined based on one or more other criteria (e.g., a measure of diversity of the data examples, accuracy, etc.) in addition to, or instead of, the number of input/output mappings.

At block 1107, processing logic provides data set T to train, validate, or test machine learning model. In some embodiments, data set T is a training set and is provided to a training engine to perform the training. In some embodiments, data set T is a validation set and is provided to a validation engine to perform the validating. In some embodiments, data set T is a testing set and is provided to a testing engine to perform the testing. In the case of a neural network, for example, input values of a given input/output mapping (e.g., numerical values associated with data inputs) are input to the neural network, and output values (e.g., numerical values associated with target outputs) of the input/output mapping are stored in the output nodes of the neural network. The connection weights in the neural network are then adjusted in accordance with a learning algorithm (e.g., back propagation, etc.), and the procedure is repeated for the other input/output mappings in data set T. After block 1107, a machine learning model can be at least one of trained using a training engine, validated using a validating engine, or tested using a testing engine. The trained machine learning model may be implemented by a control plate (e.g. control plate 106, 204) and/or a computing device (e.g. computing device 730 of FIG. 7) to identify an exposure map for a target thickness profile for a substrate.

In embodiments, a training dataset that was generated (e.g., as generated according to method 1100) is used to train a machine learning model and/or a physical model. The model may be trained to receive as an input a thickness profile or thickness map as measured from a substrate that was processed by a process chamber using a plasma process and/or an exposure map of exposure settings for plasma elements of the process chamber that were used during the process that resulted in the thickness profile or thickness map that was generated. The model may output an exposure map (e.g., an updated exposure map) that indicates exposure settings to use for each plasma element for future iterations of the process on the process chamber. In embodiments, the model may be agnostic to process chambers and/or to process recipes. Accordingly, the model may be generated based on training data items generated based on processes run on a first process chamber or first set of process chambers, and may then be used for a second process chamber without performing any transfer learning to tune the model for the second process chamber. Once the model is generated, any thickness profile and/or exposure map may be input into the model regardless of which specific process chamber was used to perform a process that resulted in the thickness profile, and the model may output an exposure map that indicates which plasma element settings to use to result in a uniform plasma etch and/or a uniform plasma-enhanced deposition. The exposure map may be input into a process chamber along with a process recipe, and the process chamber may execute the process recipe with adjustments based on the exposure map. For example, the exposure map may indicate, for each plasma element of a digital plasma source, what percentage of a time set forth in the recipe that the plasma element should be on or open during the process.

In one embodiment, the trained machine learning model is a regression model trained using regression. Examples of regression models are regression models trained using linear regression or Gaussian regression. A regression model predicts a value of Y given known values of X variables. The regression model may be trained using regression analysis, which may include interpolation and/or extrapolation. In one embodiment, parameters of the regression model are estimated using least squares. Alternatively, Bayesian linear regression, percentage regression, leas absolute deviations, nonparametric regression, scenario optimization and/or distance metric learning may be performed to train the regression model.

In one embodiment, the trained machine learning model is a decision tree, a random forest model, a support vector machine, or other type of machine learning model.

In one embodiment, the trained machine learning model is an artificial neural network (also referred to simply as a neural network). The artificial neural network may be, for example, a convolutional neural network (CNN) or a deep neural network. In one embodiment, processing logic performs supervised machine learning to train the neural network.

Artificial neural networks generally include a feature representation component with a classifier or regression layers that map features to a target output space. A convolutional neural network (CNN), for example, hosts multiple layers of convolutional filters. Pooling is performed, and non-linearities may be addressed, at lower layers, on top of which a multi-layer perceptron is commonly appended, mapping top layer features extracted by the convolutional layers to decisions (e.g. classification outputs). The neural network may be a deep network with multiple hidden layers or a shallow network with zero or a few (e.g., 1-2) hidden layers. Deep learning is a class of machine learning algorithms that use a cascade of multiple layers of nonlinear processing units for feature extraction and transformation. Each successive layer uses the output from the previous layer as input. Neural networks may learn in a supervised (e.g., classification) and/or unsupervised (e.g., pattern analysis) manner. Some neural networks (e.g., such as deep neural networks) include a hierarchy of layers, where the different layers learn different levels of representations that correspond to different levels of abstraction. In deep learning, each level learns to transform its input data into a slightly more abstract and composite representation.

Training of a neural network may be achieved in a supervised learning manner, which involves feeding a training dataset consisting of labeled inputs through the network, observing its outputs, defining an error (by measuring the difference between the outputs and the label values), and using techniques such as deep gradient descent and back-propagation to tune the weights of the network across all its layers and nodes such that the error is minimized. In many applications, repeating this process across the many labeled inputs in the training dataset yields a network that can produce correct output when presented with inputs that are different than the ones present in the training dataset. In high-dimensional settings, such as large images, this generalization is achieved when a sufficiently large and diverse training dataset is made available.

The trained machine learning model may be periodically or continuously retrained to achieve continuous learning and improvement of the trained machine learning model. The model may generate an output based on an input, an action may be performed based on the output, and a result of the action may be measured. In some instances the result of the action is measured within seconds or minutes, and in some instances it takes longer to measure the result of the action. For example, one or more additional processes may be performed before a result of the action can be measured. The action and the result of the action may indicate whether the output was a correct output and/or a difference between what the output should have been and what the output was. Accordingly, the action and the result of the action may be used to determine a target output that can be used as a label for the sensor measurements. Once the result of the action is determined, the input (e.g., thickness profile), the output of the trained machine learning model (e.g., exposure map), and the target result (e.g., target thickness profile) actual measured result (e.g., measured thickness profile) may be used to generate a new training data item. The new training data item may then be used to further train the trained machine learning model. This retraining process may be performed on-tool on the controller of the process chamber in embodiments.

In some embodiments, training the machine learning model may result in a data base for predictive processing. For example, uniform addressing ($t_{ik}=t_m \to h_{ik}(t_m)$) and singular (one cell) or some localized profile addressing $t_{ik}=t+\delta t \to \delta h_{ik}(t)$ with $\delta t_{ik}$ localized around (i, k) on the background of some level $h_{ik}(t)$, and $t_m$ is the training set.

In some embodiments, a first set of uniform input images $t_1, t_2, \ldots$ for a fixed condition can be used to generate a set of appropriate output and set of appropriate localized growth rates $\delta h_{ik}/\delta t$. These output can be tested to produce a selection of target process images. If the address images result in process images close enough to target process images (e.g., at block 1106) for a determined process range, then process logic may continue to generate other process conditions (e.g., other gases). Method 1100 may be repeated for multiple processing conditions. If the generated process image is not close (e.g. if the process is non-linear and $\hat{h}_{ik}$ depends on $h_{ik}$), then additional training time may be added between elements of the original set.

In another embodiments, previously measured thickness levels $h_{ik}(t)$ and makes localized addressing $\delta t_{ik}$.

Figure 12:
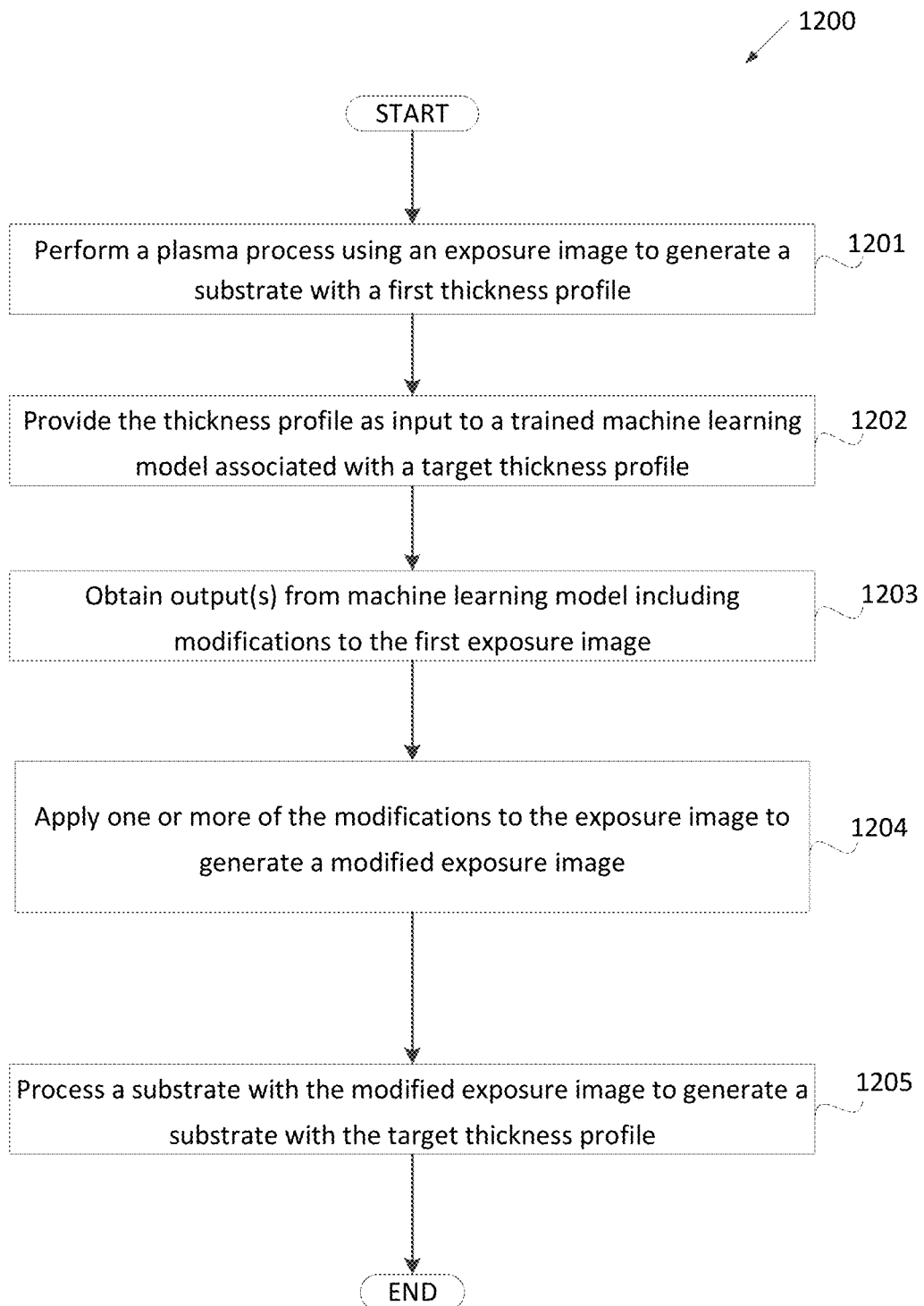
FIG. 12 is a flow chart of a method of using a machine learning model to modify a plasma exposure process, according to aspects of the disclosure.

FIG. 12 is a flow chart of a method 1200 of using a machine learning model to modify a plasma exposure process, according to aspects of the disclosure. Referring to FIG. 12, at block 1201, processing logic performs a plasma process using an exposure image (e.g. exposure map) to generate a substrate with a first thickness profile. The exposure image may include brightness or color value indicative of exposure duration for a set of plasma elements to exposure a substrate to plasma related fluxes.

In some embodiments, the exposure image is displayed (repeated) many times (M), using frames, gradually making it "brighter." Each frame uses the same image ($t_1 \tau_{ik}$) resulting in the same normalized process image $H_{ik}$, but the "brightness" grows with the number of frames until it reaches $H_{ik}$. The process time is the sum of the displaying a single frame $t_1$, $T=Mt_1$. For example, for a uniform desired process image (DPI), $H_{ik}=H=$const, the single frame process image $h_{ik}$ will also be uniform, and time will increase the "brightness"/thickness of the same image.

In another embodiment, the exposure image is displayed only once, but the whole process time is divided based on the proper number of subfields and each subfield is effectively M times longer than the appropriate subfield in the previous embodiment. In this embodiment, some areas reach $H_{ik}$ earlier, and then stop, while the other areas are still processed until the whole image reach desired brightness/thickness values. For example, for a uniform DPI $H_{ik}=H=$const, the image will not be uniform until the very end, when area one by one stop changing their brightness until the last one reaches the same value.

In another embodiments, every step of a plasma process may be characterized by a fixed time. The time may be replaced by a link to the exposure image, which controls the process time of each cell or plasma element that may have thousands of elements. The exposure image may be stored in a file such as a uniform matrix (all elements identical), which can easily be created manually, when no other files, exists, or very complex and can utilized complex algorithms for the purpose of obtaining a specific process image.

At block 1202, processing logic provides the thickness profile as input to a trained machine learning model associated with a target thickness profile. The first thickness associated with process the exposure image. The machine learning model may be configured to reach a desired target thickness profile. The target thickness profile may be associated with specifications or properties of a substrate.

At block 1203, processing logic obtains output(s) from the machine learning model including modification to the first exposure map. The machine learning model may receive the first exposure map in various formats. For example, the exposure map may be received by the machine learning mode as a map, array, matrix, series of values etc. indicative of plasma processing exposure instructions.

At block 1204, processing logic applies one or more of the modifications to the exposure map to generate a modified exposure map. In some embodiments, the modifications to the exposure map include changing one or more exposure duration values of the exposure map.

At block 1205, processing a substrate with the modified exposure map to generate a substrate with the target thickness profile. In some embodiments, process the first substrate with the modified exposure image generates a substrate with the target thickness profile. In other embodiments, processing a second substrate prior to process with the first exposure map, results in the second substrate having the target thickness profile.

Figure 13:
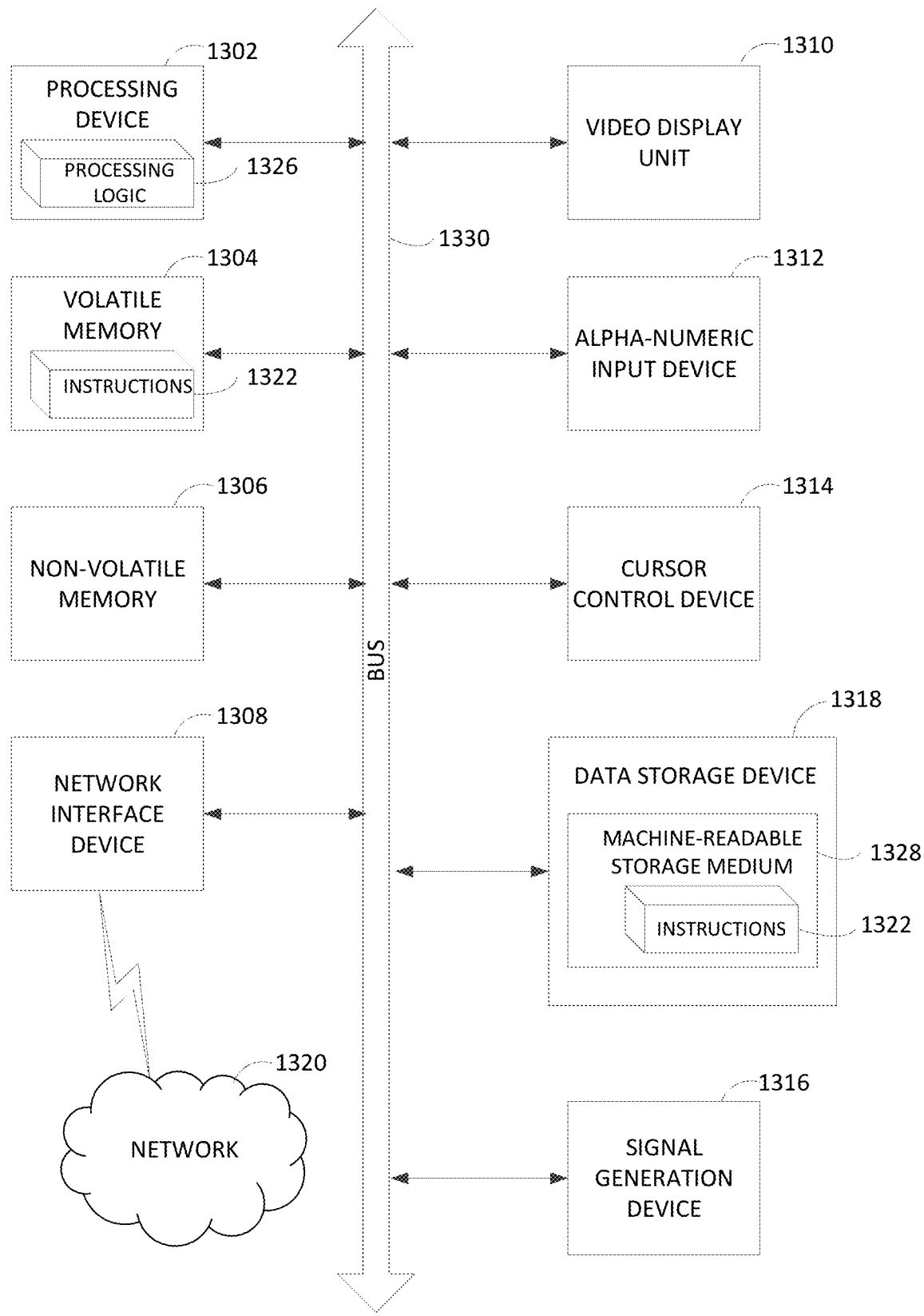
FIG. 13 depicts a block diagram of an example computing device capable of plasma delivery and/or processing, operating in accordance with one or more aspects of the disclosure.

FIG. 13 depicts a block diagram of an example computing device 1300 capable of plasma delivery and/or processing, operating in accordance with one or more aspects of the disclosure. In various illustrative examples, various components of the computing device 1300 may represent various components of the control plate (e.g. control plate 106, 204, 702 of FIGS. 1, 2, and 7), computing device (e.g. computing device 730 of FIG. 7), the training engine, validation engine, and/or the testing engine described in association with FIG. 11.

Example computing device 1300 may be connected to other computer devices in a LAN, an intranet, an extranet, and/or the Internet. Computing device 1300 may operate in the capacity of a server in a client-server network environment. Computing device 1300 may be a personal computer (PC), a set-top box (STB), a server, a network router, switch or bridge, or any device capable of executing a set of instructions (sequential or otherwise) that specify actions to be taken by that device. Further, while only a single example computing device is illustrated, the term "computer" shall also be taken to include any collection of computers that individually or jointly execute a set (or multiple sets) of instructions to perform any one or more of the methods discussed herein.

Example computing device 1300 may include a processing device 1302 (also referred to as a processor or CPU), a main memory 1304 (e.g., read-only memory (ROM), flash memory, dynamic random access memory (DRAM) such as synchronous DRAM (SDRAM), etc.), a static memory 1306 (e.g., flash memory, static random access memory (SRAM), etc.), and a secondary memory (e.g., a data storage device 1318), which may communicate with each other via a bus 1330.

Processing device 1302 represents one or more general-purpose processing devices such as a microprocessor, central processing unit, or the like. More particularly, processing device 1302 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processing device 1302 may also be one or more special-purpose processing devices such as an application specific integrated circuit (ASIC), a field programmable gate array (FPGA), a digital signal processor (DSP), network processor, or the like. In accordance with one or more aspects of the disclosure, processing device 1302 may be configured to execute instructions implementing methods 800-1200 illustrated in FIGS. 8-12.

Example computing device 1300 may further comprise a network interface device 1308, which may be communicatively coupled to a network 1320. Example computing device 1300 may further comprise a video display 1310 (e.g., a liquid crystal display (LCD), a touch screen, or a cathode ray tube (CRT)), an alphanumeric input device 1312 (e.g., a keyboard), a cursor control device 1314 (e.g., a mouse), and an acoustic signal generation device 1316 (e.g., a speaker).

Data storage device 1318 may include a machine-readable storage medium (or, more specifically, a non-transitory machine-readable storage medium) 1328 on which is stored one or more sets of executable instructions 1322. In accordance with one or more aspects of the disclosure, executable instructions 1322 may comprise executable instructions associated with executing methods 800-1200 illustrated in FIGS. 8-12.

Executable instructions 1322 may also reside, completely or at least partially, within main memory 1304 and/or within processing device 1302 during execution thereof by example computing device 1300, main memory 1304 and processing device 1302 also constituting computer-readable storage media. Executable instructions 1322 may further be transmitted or received over a network via network interface device 1308.

While the computer-readable storage medium 1328 is shown in FIG. 13 as a single medium, the term "computer-readable storage medium" should be taken to include a single medium or multiple media (e.g., a centralized or distributed database, and/or associated caches and servers) that store the one or more sets of operating instructions. The term "computer-readable storage medium" shall also be taken to include any medium that is capable of storing or encoding a set of instructions for execution by the machine that cause the machine to perform any one or more of the methods described herein. The term "computer-readable storage medium" shall accordingly be taken to include, but not be limited to, solid-state memories, and optical and magnetic media.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, as apparent from the following discussion, it is appreciated that throughout the description, discussions utilizing terms such as "identifying," "determining," "storing," "adjusting," "causing," "returning," "comparing," "creating," "stopping," "loading," "copying," "throwing," "replacing," "performing," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Examples of the disclosure also relate to an apparatus for performing the methods described herein. This apparatus may be specially constructed for the required purposes, or it may be a general purpose computer system selectively programmed by a computer program stored in the computer system. Such a computer program may be stored in a computer readable storage medium, such as, but not limited to, any type of disk including optical disks, compact disc read only memory (CD-ROMs), and magnetic-optical disks, read-only memories (ROMs), random access memories (RAMs), erasable programmable read-only memory (EPROMs), electrically erasable programmable read-only memory (EEPROMs), magnetic disk storage media, optical storage media, flash memory devices, other type of machine-accessible storage media, or any type of media suitable for storing electronic instructions, each coupled to a computer system bus.

The methods and displays presented herein are not inherently related to any particular computer or other apparatus. Various general purpose systems may be used with programs in accordance with the teachings herein, or it may prove convenient to construct a more specialized apparatus to perform the required method steps. The required structure for a variety of these systems will appear as set forth in the description below. In addition, the scope of the disclosure is not limited to any particular programming language. It will be appreciated that a variety of programming languages may be used to implement the teachings of the disclosure.

The preceding description sets forth numerous specific details such as examples of specific systems, components, methods, and so forth, in order to provide a good understanding of several embodiments of the disclosure. It will be apparent to one skilled in the art, however, that at least some embodiments of the disclosure may be practiced without these specific details. In other instances, well-known components or methods are not described in detail or are presented in simple block diagram format in order to avoid unnecessarily obscuring the disclosure. Thus, the specific details set forth are merely exemplary. Particular implementations may vary from these exemplary details and still be contemplated to be within the scope of the disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A plasma processing system, comprising:
   a processing chamber;
   an actuator plate disposed within the processing chamber, the actuator plate comprising a plurality of plasma cells,
   wherein each of the plurality of plasma cells comprises:
      a switch usable as memory for maintaining an active or inactive state of the plasma cell in response to an addressing signal during an address period; and
      an emitter to receive a sustain signal through the switch during a sustain period and operate based on the active or inactive state of the plasma cell; and
   a control unit coupled to the actuator plate, the control unit configured to control the actuator plate by independent activation and deactivation of the plurality of plasma cells, wherein responsive to being activated a plasma cell is to independently expose a local area of a substrate disposed within the processing chamber to plasma related fluxes, and wherein the control unit is configured to:
      provide the addressing signal to change a state of one or more non-transitory memory elements associated with one or more plasma cells of the plurality of plasma cells, and
      provide the sustain signal to the plasma cells to thereby operate one or more emitters of the plurality of plasma cells based on the active or inactive state of the plasma cells.

2. The plasma processing system of claim 1, wherein each of the plurality of plasma cells comprises an addressable actuator that is configured to change a status of a corresponding plasma cell between a first state (ON) corresponding to the active state and a second state (OFF) corresponding to the inactive state.

3. The plasma processing system of claim 2, wherein each addressable actuator is configured to maintain the status of the corresponding plasma cell in the first state (ON) or the second state (OFF) until receiving the addressing signal from the control unit.

4. The plasma processing system of claim 2, wherein the control unit is to control a time duration for the sustain signal to be applied to the actuator plate, wherein, when applied, the sustain signal causes a selection of plasma cells in the first state (ON) to be activated.

5. The plasma processing system of claim 2, further comprising a power supply coupled to the actuator plate and the control unit, the power supply configured to supply the actuator plate with:
   the addressing signal to change the status of a selection of plasma cells; and
   the sustain signal for a time duration, the sustain signal to activate the selection of plasma cells for the time duration, wherein the selection of plasma cells and the time duration is determined by the control unit.

6. The plasma processing system of claim 5, wherein the control unit is further configured to divide a total process time into a plurality of subfields to determine the selection of plasma cells and the time duration, wherein each subfield comprises the addressing period and the sustain period.

7. The plasma processing system of claim 1, wherein the processing chamber comprises a gas inlet and a gas outlet to control a flow of a feed gas into and out of the processing chamber.

8. The plasma processing system of claim 1, further comprising a plasma source disposed within the processing chamber, the plasma source to generate the plasma related fluxes.

9. The plasma processing system of claim 8, wherein the plasma cells comprise plasma shutters, wherein the plasma shutters are to switch between an open position and a closed position, wherein while in the open position a plasma shutter permits the plasma related fluxes of the plasma source to pass through an associated plasma cell and while in the closed position the plasma shutter blocks a selection of the plasma related fluxes from passing through the associated plasma cell.

10. The plasma processing system of claim 8, further comprising an RF power supply, wherein the plasma cells further comprise RF bias electrodes, wherein, responsive to being activated, the plasma cells expose the substrate to ions of a first energy level and responsive to being deactivated the plasma cells expose the substrate to ions of a second energy level lower than the first energy level.

11. A system, comprising:

a processing chamber;

an actuator plate disposed within the processing chamber, the actuator plate comprising a plurality of plasma elements configured to independently expose a substrate disposed within the processing chamber to plasma related fluxes, wherein each of the plurality of plasma elements comprises a switch which closes responsive to a state of an associated non-transitory memory element, the actuator plate configured to independently activate the plurality of plasma elements, wherein activating a plasma element of the plurality of plasma elements comprises providing power to a component of the plasma element through the switch of the plasma element, and wherein responsive to being activated, a plasma element is to independently expose a local area of the substrate to the plasma related fluxes, wherein the actuator plate is to perform individual time-dependent activation of the plurality of plasma elements to selectively expose the substrate to the plasma related fluxes; and a control unit, configured to:

provide an addressing signal to change a state of one or more non-transitory memory elements associated with one or more plasma elements of the plurality of plasma elements, and provide a sustain signal to activate the one or more plasma elements of the plurality of plasma elements.

12. The system of claim 11, further comprising a control unit coupled to the actuator plate, the control unit is to send a signal to the actuator plate, wherein the signal causes a selection of plasma elements to be activated for a selected time duration.

13. The system of claim 11, further comprising a plasma source disposed within the processing chamber, the plasma source to generate the plasma related fluxes.

14. The system of claim 13, wherein the plurality of plasma elements comprise plasma shutters, wherein the plasma shutters are configured to independently switch between an open position and a closed position, wherein while in the open position a plasma shutter permits the plasma related fluxes of the plasma source to pass through an associated plasma element and while in the closed position the plasma shutters blocks the plasma related fluxes from passing through the associated plasma element.

15. The system of claim 13, further comprising an RF power supply, wherein the plasma elements further comprise RF bias electrodes, wherein, responsive to being activated, the plasma elements expose the substrate to ions of a first energy level and responsive to being deactivated, the plasma elements expose the substrate to ions of a second energy level lower than the first energy level.

16. A plasma processing device, comprising:

a plasma source to generate a plasma, the plasma to generate plasma related fluxes; and an actuator plate disposed in a path of the plasma, the actuator plate comprising a plurality of plasma elements configured to independently be activated and deactivated, wherein responsive to being activated, a plasma element exposes a substrate to the plasma related fluxes; and a control unit configured to control the actuator plate, wherein to control the actuator plate the control unit is to:

cause a first addressing signal to be provided to a first subset of the plurality of plasma elements, wherein the first addressing signal causes a change in a state of the first subset of the plurality of plasma elements, and wherein each of the first subset of the plurality of plasma elements comprises a switch which is to close responsive to the change in the state, and cause a sustain signal to be provided to a component of the first subset of the plurality of plasma elements, wherein the control unit is to perform individual time-dependent activation of the plurality of plasma elements to selectively expose the substrate to the plasma related fluxes.

17. The plasma processing device of claim 16, further comprising a power supply configured to supply the actuator plate with:

the first addressing signal configured to change a status of a selection of plasma elements; and the sustain signal for a time duration, the sustain signal configured to activate the selection of plasma elements for the time duration, wherein the selection of plasma elements and the time duration is determined by the control unit.

18. The plasma processing device of claim 17, wherein the control unit is further to divide a total process time into a plurality of subfields to determine the selection of plasma elements and the time duration, wherein each subfield comprises an addressing period and a sustaining period.

19. The plasma processing device of claim 16, wherein the plasma elements comprise plasma shutters, wherein the plasma shutters are to switch between an open position and a closed position, wherein while in the open position a plasma shutter permits the plasma related fluxes to pass through an associated plasma element of the actuator plate and while in the closed position the plasma shutter blocks a selection of the plasma related fluxes from passing through the associated plasma element.

20. The plasma processing device of claim 16, further comprising an RF power supply, wherein the plasma elements further comprise RF bias electrodes, wherein, responsive to being activated, the plasma elements expose the substrate to ions of a first energy level and responsive to being deactivated, the plasma elements expose the substrate to ions of a second energy level lower than the first energy level.

* * * * *